(12) United States Patent
Kakehata

(10) Patent No.: US 7,994,022 B2
(45) Date of Patent: Aug. 9, 2011

(54) SEMICONDUCTOR SUBSTRATE AND SEMICONDUCTOR DEVICE AND MANUFACTURING METHOD OF THE SAME

(75) Inventor: Tetsuya Kakehata, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 132 days.

(21) Appl. No.: 12/249,437

(22) Filed: Oct. 10, 2008

(65) Prior Publication Data

US 2009/0102008 A1 Apr. 23, 2009

(30) Foreign Application Priority Data

Oct. 19, 2007 (JP) .................................. 2007-272297

(51) Int. Cl.
*H01L 21/30* (2006.01)
(52) U.S. Cl. ........ 438/458; 438/149; 438/164; 438/166; 438/455; 438/459
(58) Field of Classification Search .................. 438/149, 438/150, 162, 164, 166, 455, 458, 459, 463, 438/464
See application file for complete search history.

(56) References Cited

U.S. PATENT DOCUMENTS

| 6,372,609 | B1 | 4/2002 | Aga et al. |
| 6,628,367 | B2 | 9/2003 | Hirabayashi et al. |
| 6,683,592 | B1 | 1/2004 | Murade |
| 6,850,292 | B1 | 2/2005 | Murade |
| 6,897,932 | B2 | 5/2005 | Murade et al. |
| 7,018,909 | B2 * | 3/2006 | Ghyselen et al. ............. 438/455 |
| 7,666,757 | B2 * | 2/2010 | Ohnuma ....................... 438/455 |
| 7,781,306 | B2 * | 8/2010 | Kakehata ....................... 438/455 |
| 2005/0282356 | A1 * | 12/2005 | Lee ............................... 438/458 |
| 2008/0286910 | A1 * | 11/2008 | Yamazaki et al. ............. 438/151 |

FOREIGN PATENT DOCUMENTS

| EP | 1 045 448 A1 | 10/2000 |
| JP | 11-163363 | 6/1999 |
| JP | 2000-124092 | 4/2000 |

* cited by examiner

*Primary Examiner* — Kevin M Picardat
(74) *Attorney, Agent, or Firm* — Fish & Richardson P.C.

(57) ABSTRACT

A semiconductor substrate having an SOI layer is provided. Between an SOI layer and a glass substrate, a bonding layer is provided which is formed of one layer or a plurality of layers of phosphosilicate glass, borosilicate glass, and/or borophosphosilicate glass, using organosilane as one material by a thermal CVD method at a temperature of 500° C. to 800° C.

6 Claims, 14 Drawing Sheets

SEMICONDUCTOR SUBSTRATE AND SEMICONDUCTOR DEVICE AND MANUFACTURING METHOD OF THE SAME

BACKGROUND OF THE INVENTION

1. Field of the Invention

The present invention relates to a method for manufacturing semiconductor substrates each having an SOI (silicon on insulator) structure in which a semiconductor layer is provided on an insulating surface and a method for manufacturing semiconductor devices each having an SOI structure.

2. Description of the Related Art

In recent years, development of electric appliances and electronic devices has not been stopped and higher-speed semiconductor devices have been demanded. Further, with development of portable devices and increasing of energy demand, decreasing of power consumption is also one big development theme. Due to such a background, as compared to a semiconductor device manufactured using a bulk silicon substrate, an SOI technology capable of providing a high-speed, low-power-consumption semiconductor device has attracted attention. The SOI technology is a technology in which a substrate having a structure in which a thin semiconductor layer is provided over an insulator is manufactured and a semiconductor device is provided using the substrate. The semiconductor device manufactured according to the SOI technology has characteristics in that, for example, parasitic capacitance between a drain and a substrate of a transistor is small and a leakage current into the substrate is small. Furthermore, when the SOI technology is used, a semiconductor layer used for an active layer of a transistor can be thinned, so that a completely-depleted transistor can be manufactured, and further high performance can be achieved.

Further, the semiconductor device manufactured using such a substrate also has a characteristic in that a short-channel effect can be effectively suppressed to be able to realize high-density integration, and characteristics in that circuit breakdown (i.e., latch-up) due to parasitic thyristor, that is a capital problem in a semiconductor device manufactured using a bulk silicon substrate, and against which, various measures such as circuit design have been taken, does not occur in principle.

As a method for manufacturing a semiconductor substrate having an SOI structure, a hydrogen-ion-implantation separation method is known (e.g., see Japanese Published Patent Application No. 2000-124092). According to the hydrogen-ion-implantation separation method, hydrogen ions are implanted into a silicon wafer provided with an oxide film on the surface, to form a microbubble layer at a given depth from the surface, and a silicon layer with a desired thickness is bonded to a silicon wafer by using the microbubble layer as a cleavage plane. In this method, it is necessary to perform, in addition to thermal treatment for separation at a temperature equal to or higher than 500° C., thermal treatment at a temperature of 1000° C. to 1300° C. under an inert gas atmosphere in order to increase the bonding strength.

On the other hand, a semiconductor device in which a silicon layer is formed over an insulating substrate such as a high-heat-resistant glass substrate is disclosed (e.g., Japanese Published Patent Application No. H11-163363). The semiconductor device has a structure in which an entire surface of crystallized glass, a strain point of which is equal to or greater than 750° C., is protected by an insulating silicon film and the silicon layer obtained by the hydrogen-ion-implantation separation method is firmly fixed over the insulating silicon film.

SUMMARY OF THE INVENTION

Glass substrates used in the electronics industry, such as an aluminosilicate glass substrate, an aluminoborosilicate glass substrate, and a barium borosilicate glass substrate can be easily increased in area and are inexpensive as compared to a quartz substrate or the like; and therefore, such a glass substrate has been used as a substrate of a display device such as a liquid crystal panel. However, the allowable temperature limit of such a glass substrate is generally low and thermal treatment at a high temperature equal to or higher than 1000° C. is needed to strengthen bonding between a separated semiconductor layer and a silicon substrate in the method for manufacturing a semiconductor substrate by a conventional hydrogen-ion-implantation separation method. Therefore, the glass substrate has not been able to be provided with a semiconductor layer having a bonding strength high enough for practical use by the conventional hydrogen-ion-implantation separation method.

Furthermore, in the case of the above-described glass substrate, there is also a problem in that highly mobile impurity ions of sodium or the like exist in the glass substrate and the operation of a semiconductor device formed over the glass substrate is made to be unstable by the impurity ions.

In view of the foregoing problems, the present invention provides a semiconductor substrate having an SOI layer capable of manufacturing a semiconductor device which withstands practical use and has stable characteristics even when a low-heat-resistant substrate such as a glass substrate is used. The present invention provides a method for manufacturing such a semiconductor substrate. The present invention provides a semiconductor device using such a semiconductor substrate and a manufacturing method thereof.

According to the present invention, in order to solve the foregoing problems, between an SOI layer (any single crystal semiconductor layer which is bonded to a glass substrate with an insulating layer interposed therebetween is referred to as the 'SOI layer' in this specification) and a base substrate formed of an insulating substrate or a substrate having an insulating surface such as a glass substrate, a bonding layer is provided which is formed of one layer or a plurality of layers of silicon oxide containing phosphorus (also called phosphosilicate glass or PSG), silicon oxide containing boron (also called borosilicate glass or BSG), and/or silicon oxide containing phosphorus and boron (also called borophosphosilicate glass or BPSG), using organosilane typified by TEOS (tetraethoxysilane) as one material by a thermal CVD method at a temperature equal to or higher than 500° C. and equal to or lower than 800° C.

By provision of the film formed of PSG, BSG, or BPSG by the thermal CVD method using organosilane as one material source at a temperature equal to or higher than 500° C. and equal to or lower than 800° C., the semiconductor layer can be attached to the base substrate such as a glass substrate (bonding can be formed between the base substrate and such a film). Further, the film formed of one or a plurality of PSG, BSG, and BPSG by the thermal CVD method using organosilane as one material source at a temperature equal to or higher than 500° C. and equal to or lower than 800° C. is a film having a very smooth surface, and therefore, strong bonding can be formed by thermal treatment at a temperature equal to or lower than 700° C. According to this structure, an SOI layer having a bonding portion with high bonding strength can be obtained even over a base substrate the allowable temperature limit of which is 700° C. or less. Further, since the layer containing one or a plurality of PSG, BSG, and BPSG exists between the base substrate and the SOI layer, the SOI layer can be prevented from being adversely affected by highly mobile impurity ions which might be contained in the base substrate, and the operation of a semiconductor device manufactured using the SOI layer can be stably maintained. Further, the bonding layer also functions as a blocking layer for preventing impurity diffusion, so that increase of the number of manufacturing steps or a drop in yield can be reduced.

According to another structure of the present invention, in order to solve the foregoing problems, between an SOI layer and a base substrate, a layer is used, as a bonding layer, which is formed of one or a plurality of silicon oxide containing phosphorus (also called phosphosilicate glass or PSG), silicon oxide containing boron (also called borosilicate glass or BSG), and silicon oxide containing phosphorus and boron (also called borophosphosilicate glass or BPSG), using organosilane typified by TEOS (tetraethoxysilane) as one material by a thermal CVD method at a temperature equal to or higher than 500° C. and equal to or lower than 800° C., and then reflowed at a temperature of 800° C. to 1000° C.

PSG, BSGC or BPSG deposited by the thermal CVD method using organosilane as one material source at a temperature equal to or higher than 500° C. and equal to or lower than 800° C. and reflowed at a temperature of 800° C. to 1000° C. is a film having a very smooth surface, and therefore, a strong bond to the base substrate can be formed at a temperature equal to or lower than 700° C. According to this structure, an SOI layer having a bonding portion with high bond strength can be obtained even over a base substrate the allowable temperature limit of which is 700° C. or less. Further, since the layer containing one or a plurality of PSG, BSG, and BPSG exists between the base substrate and the SOI layer, the SOI layer can be prevented from being adversely affected by highly mobile impurity ions which might be contained in the base substrate, and the operation of a semiconductor device manufactured using the SOI layer can be stably maintained. Further, the bonding layer also functions as a barrier layer, so that increase of the number of manufacturing steps and a drop in yield can be reduced.

As an organosilane gas, the following silicon-containing compound can be used: tetraethyl orthosilicate (TEOS) (chemical formula: $Si(OC_2H_5)_4$); trimethylsilane (TMS) (chemical formula: $(CH_3)_3SiH$); tetramethylsilane (chemical formula: $Si(CH_3)_4$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); trisdimethylaminosilane (chemical formula: $SiH(N(CH_3)_2)_3$); or the like.

The SOI layer which is bonded to the base substrate can be obtained by the following manner; a damaged region is formed in a bond substrate formed of a crystalline semiconductor substrate, and the bond substrate is cleaved and separated at the damaged region. The damaged region can be formed by adding ions of hydrogen, helium, or halogen typified by fluorine. In this case, either one kind of ions or plural kinds of ions of the same atom but different masses may be added. In the case of adding hydrogen ions, it is preferable that the hydrogen ions include $H^+$, $H_2^+$, and $H_3^+$ ions with a high proportion of $H_3^+$ ions.

A barrier layer may be formed between the bond substrate and the bonding layer. The barrier layer can be formed of a single layer or a stacked-layer structure of a plurality of layers selected from a silicon nitride layer, a silicon oxide layer, a silicon nitride oxide layer, or a silicon oxynitride layer. In the case where the bond substrate is a substrate made of silicon, it is preferable that the barrier layer be a silicon oxide film formed by thermal oxidation.

According to another structure of the present invention, a method for manufacturing a semiconductor substrate is provided, in which: a bonding layer is formed over a bond substrate, of one or a plurality of layers of phosphosilicate glass, borosilicate glass, and borophosphosilicate glass, using organosilane as one material by a thermal CVD method at a temperature equal to or higher than 500° C. and equal to or lower than 800° C.; ions are added from the surface where the bonding layer is formed to form a damaged region at a given depth of the bond substrate; and thermal treatment by which the damaged region cracks and the bond substrate is separated at the damaged region is performed in the state in which the bond substrate and a glass substrate are overlapped with the bonding layer interposed therebetween, so that a semiconductor layer which is separated from the bond substrate is formed over the glass substrate.

According to this, the semiconductor layer which is strongly bonded can be formed even over the glass substrate which is thermally fragile and highly mobile impurity elements contained in the glass substrate can be prevented from moving into the semiconductor layer, so that a semiconductor substrate capable of manufacturing a high-performance, highly reliable semiconductor element can be provided.

In addition to the above-described structure, an insulating film which functions as a barrier layer may be provided for at least the surface where the bonding layer is formed, of the bond substrate before the bonding layer is formed. According to this, phosphorus or boron contained in the bonding layer can be prevented from moving into the semiconductor layer, so that a semiconductor substrate capable of manufacturing a highly stable, highly reliable semiconductor element can be provided.

In the case where the bond substrate is made of single crystal silicon, it is preferable that the barrier layer be a silicon oxide film obtained by thermal oxidation of a single crystal silicon substrate. According to this, as compared with a film which is formed by deposition, the probability of occurrence of defects due to particles can be suppressed, so that semiconductor substrates can be manufactured with high yield.

Further, by performing thermal oxidation for forming the barrier layer under a halogen-containing atmosphere, an adverse effect of contamination on the semiconductor layer in the case where the bond substrate is contaminated can be suppressed.

By reflowing the bonding layer after the bonding layer is formed, degree of surface flatness of the bonding layer is further increased, so that the semiconductor layer and the glass substrate can be strongly bonded to each other.

A semiconductor element can be formed using the semiconductor layer formed in the method for manufacturing a semiconductor substrate, and a display element which is electrically connected to the semiconductor element can be formed.

Note that, in the present invention, a semiconductor device refers to a device which can function by utilizing the semiconductor characteristics. By using the present invention, a device having a circuit including a semiconductor element (e.g., a transistor, a memory element, or a diode) or a semiconductor device such as a chip including a processor circuit can be manufactured.

The present invention can also be applied to a semiconductor device having a display function (also referred to as a display device). As examples of the semiconductor device using the present invention, a semiconductor device (a light-emitting display device) in which a light-emitting element including a layer containing an organic material, an inorganic material, or a mixture of an organic material and an inorganic material, which exhibits light-emission called electroluminescence (hereinafter also referred to as EL) and is interposed between electrodes is connected to a TFT; a semiconductor device (a liquid crystal display device) using a liquid crystal element containing a liquid crystal material as a display element; and the like can be given. In this specification, a display device refers to a device having a display element. The display device also includes a main body of a display panel for which a plurality of pixels including a display element and a peripheral driver circuit for driving the pixels are provided over a substrate. Further, the display device may include one which is provided with a flexible printed circuit (FPC) or a printed wiring board (PWB) (such as an IC, a resistor, a capacitor, an inductor, or a transistor). Further, the display device may also include an optical sheet such as a polarizing plate or a retardation plate. Further, the display device may include a backlight unit (which may include a light guide plate, a prism sheet, a diffusion sheet, a reflective sheet, or a light source (e.g., an LED or a cold-cathode tube)).

Note that the display element or the semiconductor device can be in various modes and may include various elements. For example, a display medium in which contrast is changed by an electromagnetic effect can be applied, such as an EL element (an organic EL element, an inorganic EL element, or an EL element containing an organic compound and an inorganic compound), an electron-emitting element, a liquid crystal element, electronic ink, a grating light valve (GLV), a plasma display (PDP), a digital micromirror device (DMD), a piezoelectric ceramic display, or a carbon nanotube. Note that a semiconductor device using an EL element includes an EL display; a semiconductor device using an electron-emitting element includes a field emission display (FED), an SED (surface-conduction electron-emitter display) type flat panel display, and the like; a semiconductor device using a liquid crystal element includes a liquid crystal display, a transmissive liquid crystal display, a semi-transmissive liquid crystal display, and a reflective liquid crystal display; and a semiconductor device using an electron ink includes electronic paper.

According to the present invention, a high-performance semiconductor device with stable operation can be manufactured over a glass substrate which is inexpensive and easily increased in area. The semiconductor device can be manufactured without a large increase of the number of manufacturing steps and drop in yield.

That is, according to the present invention, a glass substrate and a semiconductor layer made of, for example, single crystal silicon can be strongly bonded to each other at a relatively low temperature, and mobile impurity elements which exist in the glass substrate can be prevented from diffusing into the bonded single crystal semiconductor layer. Further, since a bonding layer also functions as a blocking layer in the structure of the present invention, the number of manufacturing steps can be reduced and the probability of occurrence of defects can be decreased, so that the yield can be improved. Throughput is also improved.

By using the semiconductor layer provided for such a substrate, high-performance semiconductor devices including various semiconductor elements, memory elements, integrated circuits, and the like can be manufactured with high yield.

DETAILED DESCRIPTION OF THE INVENTION

Figure 1A:
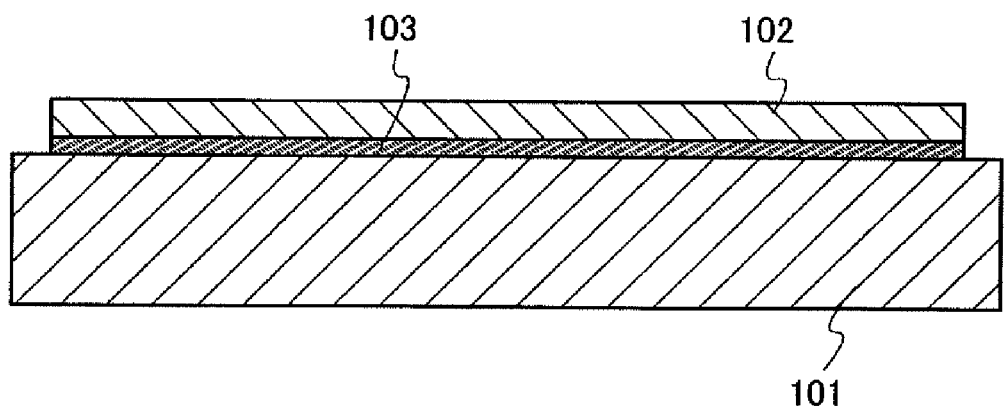
FIGS. 1A and 1B are diagrams describing a semiconductor substrate of the present invention.

Embodiment modes of the present invention will be described in detail using drawings. The present invention is not limited to the following description, and it is easily understood by those skilled in the art that modes and details herein disclosed can be modified in various ways without departing from the spirit and scope of the present invention. Therefore, the present invention is not to be construed with limitation to what is described in the embodiment modes. Note that the same portions or portions having similar functions are denoted by the same reference numerals through different diagrams in structures of the present invention described hereinafter, and repetitive description thereof is omitted.

Embodiment Mode 1

Figure 1B:
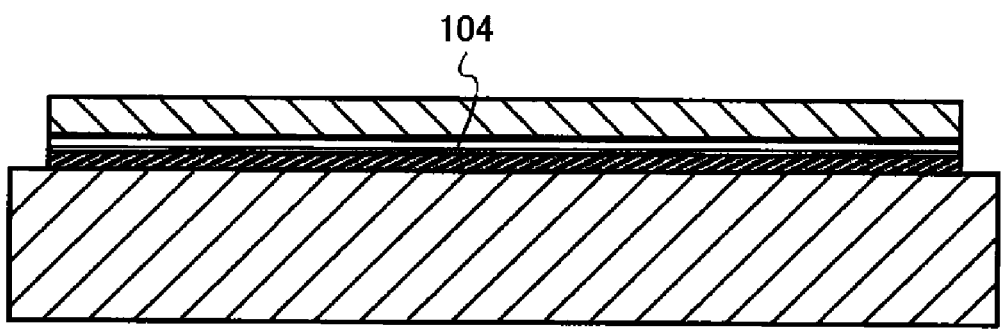

FIGS. 1A and 1B each show a semiconductor substrate according to the present invention. Note that, in this specification, a semiconductor substrate refers to a substrate in which a semiconductor layer is provided over a substrate having an insulating surface or an insulating substrate. Although the semiconductor layer is a single crystal semiconductor layer in many cases, a layer made of a polycrystal or a compound semiconductor may be used as well.

In FIG. 1A, a base substrate 101 is a substrate having an insulating surface or an insulating substrate, and any of a variety of glass substrates that are used in the electronics industry, such as an aluminosilicate glass substrate, an aluminoborosilicate glass substrate, and a barium borosilicate glass substrate, can be used. As the glass substrate, it is preferable to use a glass substrate having a coefficient of thermal expansion which is equal to or higher than $25 \times 10^{-7}/°$C. and equal to or lower than $50 \times 10^{-7}/°$C. (more preferably, equal to or higher than $30 \times 10^{-7}/°$C. and equal to or lower than $40\times10^{-7}/°$ C.) and a distortion temperature which is equal to or higher than 580° C. and equal to or lower than 700° C. (more preferably, equal to or higher than 650° C. and equal to or lower than 690° C.). Furthermore, in order to suppress contamination of a semiconductor device, a non-alkali glass substrate is preferably used as the glass substrate. Materials of alkali-free substrates include glass materials such as aluminosilicate glass, aluminoborosilicate glass, and barium borosilicate glass. For example, it is preferable that an alkali-free glass substrate (AN 100), an alkali-free glass substrate (EAGLE 2000 (registered trademark)), or an alkali-free glass substrate (EAGLE XG (registered trademark)) be used as the base substrate 101. As a semiconductor layer (also referred to as an SOI layer) 102, single crystal silicon is typically used, and a crystalline semiconductor layer made of silicon, germanium, or a compound semiconductor such as gallium arsenide or indium phosphide which can be separated from a single crystal semiconductor substrate or a polycrystalline semiconductor substrate can be used as well. The single crystal semiconductor substrate or the polycrystalline semiconductor substrate, which is used for separating such a semiconductor layer, is referred to as a bond substrate in this specification.

Between the base substrate 101 and the semiconductor layer 102, a bonding layer 103 formed of at least one kind of phosphosilicate glass (PSG), borosilicate glass (BSG), and borophosphosilicate glass (BPSG) is provided. The bonding layer 103 is formed of a film of phosphosilicate glass (PSG), borosilicate glass (BSG), or borophosphosilicate glass (BPSG) deposited by a thermal CVD method using organosilane as one material at a temperature equal to or higher than 500° C. and equal to or lower than 800° C. As an organosilane gas, the following silicon-containing compound can be used: tetraethoxysilane (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); trisdimethylaminosilane (chemical formula: $SiH(N(CH_3)_2)_3$); or the like. Further, in the case of depositing the bonding layer 103, a gas which is able to provide oxygen is mixed. As the gas which can provide oxygen, oxygen, nitrous oxide, nitrogen dioxide, or the like can be used. In addition, an inert gas such as argon, helium, nitrogen, or hydrogen may be mixed. The film deposition at the temperature equal to or higher than 500° C. and equal to or lower than 800° C. allows a layer having a smooth surface of PSG, BSG, or BPSG to be formed and strong bonding can be obtained at a relatively low temperature, so that the semiconductor layer 102 can be bonded strongly to the base substrate 101 made of glass.

Since the bonding layer 103 contains one or both of phosphorus and boron, highly mobile impurity ions typified by sodium ions in the base substrate 101 are taken into and fixed (the operation is also called gettering) in the bonding layer 103, so that the impurity elements can be prevented from being diffused into the semiconductor layer 102 and the operation of a semiconductor element manufactured using the semiconductor layer 102 can be prevented from being made unstable. The stress of each of the PSG, BSG, and BPSG is not large so much; therefore, there is no possibility of causing peeling or unintended distortion of the semiconductor element. Further, deposition rate can be relatively high, which is also advantageous in take time. In addition, since the film of PSG, BSG, or BPSG actively takes impurity elements into and fixes them, the semiconductor layer 102 can be prevented from being affected by contamination by metal such as sodium which might occur at the interface between the bonding layer 103 and the semiconductor layer 102.

The bonding layer 103 is formed with a thickness of 5 to 500 nm. With this thickness, surface roughness of a film to be formed can be smoothed, smoothness of the growth surface of the film can be obtained, and diffusion of highly mobile impurity ions from the base substrate to the semiconductor layer 102 can be effectively prevented. Further, distortion between the semiconductor layer and a substrate which is bonded later can be relieved.

FIG. 1B shows a structure in which a barrier layer 104 is provided for the semiconductor layer 102. The barrier layer 104 may be provided to prevent diffusion of phosphorus or boron contained in the bonding layer 103. The barrier layer 104 may be formed of one or a plurality of layers using an insulating film such as an oxide film or a nitride film. When the semiconductor layer 102 is single crystal silicon, silicon oxide, silicon nitride, silicon oxynitride, silicon nitride oxide, etc. can be used. For a layer which is in contact with the semiconductor layer, a silicon oxide series material such as silicon oxide or silicon nitride oxide may be used. Preferably, silicon oxide manufactured by thermal oxidation of the semiconductor layer is used as the barrier layer 104, so that occurrence of a defect due to particles can be decreased as compared to the case of using a barrier layer formed by deposition.

Note that, in this specification, a silicon oxynitride film means a film that contains higher composition of oxygen than nitrogen and shows concentration ranges of oxygen, nitrogen, silicon, and hydrogen from 55 to 65 at. %, 1 to 20 at. %, 25 to 35 at. %, and 0.1 to 10 at. %, respectively. Further, a silicon nitride oxide film means a film that contains higher composition of nitrogen than oxygen, and shows the concentration ranges of oxygen, nitrogen, silicon, and hydrogen from 15 to 30 at. %, 20 to 35 at. %, 25 to 35 at. %, and 15 to 25 at. %, respectively.

A semiconductor substrate and a method for manufacturing a semiconductor device of the present invention will be described using FIGS. 1A and 1B, FIGS. 2A to 2D, and FIG. 3.

First, a method in which a semiconductor layer is provided over a base substrate which is a substrate having an insulating surface by separation from a bond substrate 108 will be described using FIGS. 2A to 2D and FIG. 3.

In this embodiment mode, a single crystal silicon substrate is used as one example of the bond substrate 108. First, the surface of the bond substrate is cleaned. The cleaning of the bond substrate 108 is performed in order to remove a natural oxide film and contaminant such as dust attached on the surface; for example, the surface is treated with diluted hydrofluoric acid.

As the bond substrate 108, a bond substrate such as a silicon substrate or a germanium substrate; or a compound semiconductor substrate such as a gallium arsenide substrate or an indium phosphide substrate can be used. It is preferable that a single crystal substrate be used as the bond substrate 108, but a polycrystalline semiconductor substrate may be used as well. The semiconductor layer obtained over the base substrate can be determined by selection of the bond substrate which is a base.

The bond substrate 108 is processed into a desired size and shape. Considering that the bond substrate 108 is attached to the base substrate 101 and that a light-exposure region with an exposure apparatus such as a reduced-projection exposure apparatus is rectangular, it is preferable that the shape of the bond substrate 108 be a rectangle. The bond substrate 108 is not limited to be rectangular, but any of bond substrates having various shapes can be used. For example, as well as a rectangular substrate, a polygonal substrate such as a triangular, pentagonal, or hexagonal substrate can be used. A commercial discoid semiconductor wafer can also be used as the bond substrate 108.

The rectangular bond substrate 108 can be formed by cutting a commercial circular bulk bond substrate. For cutting the substrate, a cutting device such as a dicer or a wire saw, a device using a laser beam, a device using plasma, a device using an electron beam, or another device for cutting can be used. Alternatively, the rectangular bond substrate 108 can be formed by processing an ingot for manufacturing a bond substrate, before slicing as a substrate, into a rectangular solid to have a rectangular cross section, and then, by slicing the rectangular solid ingot.

Note that, when a substrate made of a Group IV element in the periodic table of the elements where the crystal structure is a diamond structure such as a single crystal silicon substrate is used as the bond substrate 108, the plane orientation of its main surface may be (100), (110), or (111). Using of a substrate having a main surface of a (100) plane as the bond substrate 108 enables the interface state density between the semiconductor layer 102 and an insulating layer formed thereon to be decreased, and thus is suitable for manufacturing a field-effect transistor.

Using of a substrate having a main surface of a (110) plane as the bond substrate 108 enables the bonding between an element included in the bonding layer 103 and the Group IV element (e.g., a silicon element) included in the semiconductor layer 102 to be formed strongly at the bonding plane between the bonding layer 103 and the semiconductor layer 102, so that the bonding strength between the bonding layer 103 and the semiconductor layer 102 is enhanced.

By using the substrate having a main surface of a (110) plane as the bond substrate 108, the degree of flatness of the semiconductor layer 102 manufactured using the bond substrate 108 is improved because atoms are arranged in the main surface denser than those in other plane orientations. Therefore, a transistor manufactured using the semiconductor layer 102 has good electrical characteristics such as a small S factor and high field-effect mobility. Note that the bond substrate having the main surface of a (110) plane has an advantage in that the Young's modulus is higher than that in a bond substrate having the main surface of a (100) plane and cleavage occurs more easily.

Next, the bonding layer 103 is formed on a plane of the bond substrate 108 which forms bonding with the base substrate. As the bonding layer 103, a film made of one or a plurality of kinds of PSG, BSG, and BPSG is formed. The film made of PSG, BSG, or BPSG is deposited by a thermal CVD method using organosilane as one material at a temperature of 500° C. to 800° C. As an organosilane gas, the following silicon-containing compound can be used: triethyl borate (TEOS) (chemical formula: $Si(OC_2H_5)_4$); trimethylsilane (TMS) (chemical formula: $(CH_3)_3SiH$); tetramethylsilane (chemical formula: $Si(CH_3)_4$); tetramethylcyclotetrasiloxane (TMCTS); octamethylcyclotetrasiloxane (OMCTS); hexamethyldisilazane (HMDS); triethoxysilane (chemical formula: $SiH(OC_2H_5)_3$); trisdimethylaminosilane (chemical formula: $SiH(N(CH_3)_2)_3$); or the like. In the case where a BSG film is manufactured, the film can be formed by the above-described organosilane and alkoxyboron typified by triethyl borate ($B(OC_2H_5)_3$) or trimethyl borate ($B(OCH_3)_3$) may be used. In the case where a PSG film is manufactured, the film may be formed of the above-described organosilane and alkoxy phospholipid typified by triethyl phosphate $((OC_2H_5)_3P=O)$ or trimethyl phosphate $((OCH_3)_3P=O)$.

Note that, in the case where a silicon oxide layer is formed by a thermal CVD method using organosilane as a source gas, a gas which is able to provide oxygen is mixed. As the gas which can provide oxygen, oxygen, nitrous oxide, nitrogen dioxide, or the like can be used. In addition, an inert gas such as argon, helium, nitrogen, or hydrogen may be mixed.

The bonding layer 103 is formed with a thickness of 5 to 500 nm, preferably 10 to 200 nm. With this thickness, surface roughness of a film to be formed can be smoothed, and smoothness of the growth surface of the film can be obtained. Further, distortion between the bonding layer and a base substrate which is bonded later can be relieved.

The barrier layer 104 may be formed over the bond substrate 108 before the bonding layer 103 is formed. The barrier layer 104 may be provided to prevent diffusion of phosphorus or boron contained in the bonding layer 103. The barrier layer 104 may be formed of one or a plurality of layers using an insulating film such as an oxide film or a nitride film. When the bond substrate 108 is silicon, silicon oxide, silicon nitride, silicon oxynitride, silicon nitride oxide, etc. can be used. For a layer which is in contact with the bond substrate 108 made of silicon, a silicon oxide series material such as silicon oxide or silicon nitride oxide may be used. Preferably, silicon oxide manufactured by thermal oxidation of the bond substrate 108 is used as the barrier layer 104. The thermal oxidation for forming the barrier layer is performed after the bond substrate is degreased to remove an oxide film on the surface. As the thermal oxidation, although normal dry oxidation may be performed, oxidation in an oxidizing atmosphere to which halogen is added is preferably performed. For example, thermal treatment is performed at a temperature equal to or higher than 700° C. in an atmosphere containing HCl at 0.5 to 10 vol. % (preferably 3 vol. %) with respect to oxygen to form an oxide film. The heat oxidation is preferably performed at a temperature of 950° C. to 1100° C. Processing time may be 0.1 to 6 hours, preferably 0.5 to 1 hour. The thickness of the oxide film to be formed is set to 10 to 1000 nm (preferably, 50 to 200 nm), and for example, 100 nm.

Such thermal treatment can provide gettering effect by halogen elements. Gettering particularly has an effect of removing a metal impurity. In other words, by action of a halogen element such as chlorine, an impurity such as metal turns into volatile halide and moves into the air to be removed. The surface of the bond substrate 108 subjected to chemical mechanical polishing (CMP) process is slightly contaminated by a metal impurity in some cases. Hence, it is preferable to use the thermal treatment.

As examples of the material source for adding halogen, in addition to HCl, the following can be given: HF, $NF_3$, HBr, $Cl_2$, $ClF_3$, $BCl_3$, $F_2$, $Br_2$, and the like. One or a plurality of kinds of them can be used.

The barrier layer formed by thermal oxidation can also reduce occurrence of defects due to particles more than a barrier layer deposited by a CVD method or the like.

In the case where the barrier layer 104 is formed, the barrier layer 104 is formed, and then, the bonding layer 103 is formed over the barrier layer 104.

Subsequently, the surface of the bonding layer 103 is irradiated with an ion beam accelerated by an electric field so that ions are added into a given depth of the bond substrate 108, thereby forming a damaged region 110. The ion beam is generated as follows; a source gas is excited to generate plasma of the source gas, and ions included in the plasma are extracted from the plasma by an electric field. The position of the damaged region 110 can be controlled by the acceleration energy and incident angle of the ion beam irradiation. Further, the thickness of a semiconductor layer which is to be disposed over the base substrate 101 can be controlled by the depth at which the damaged region is formed in the bond substrate. The depth at which the damaged region 110 is formed is controlled such that the thickness of this semiconductor layer is equal to or more than 20 nm and equal to or less than 500 nm, preferably equal to or more than 20 nm and equal to or less than 200 nm. Note that after the semiconductor layer is disposed over the base substrate, the thickness of the semiconductor layer can be controlled by etching treatment or polishing treatment. The acceleration energy can be controlled by an acceleration voltage, a dose, or the like. The damaged region 110 is formed in a region as deep as the average depth at which the ions are entered.

As the method for adding ions into the bond substrate 108, an ion implantation method with mass separation or an ion doping method without mass separation can be used. The ion doping method without mass separation is preferable in that tack time to form the damaged region 110 in the bond substrate 108 can be shortened.

As the ions for forming the damaged region 110, ions of hydrogen, helium, or halogen typified by fluorine can be, for example, used. In the case where a fluorine ion is added as the halogen element, $BF_3$ may be used for the source gas.

When hydrogen ($H_2$) is used for the source gas, plasma including $H^+$, $H_2^+$, and $H_3^+$ can be generated by exciting a hydrogen gas. The proportions of ion species generated from the source gas can be changed by adjusting a plasma excitation method, pressure of an atmosphere for generating plasma, the supply of the source gas, and the like. The number of hydrogen atoms of $H_3^+$ is larger than that of each of the other hydrogen ion species ($H^+$ and $H_2^+$) and thus, the mass of $H_3^+$ is larger. Therefore, $H_3^+$ is added at a smaller depth of the bond substrate 108 than $H^+$ and $H_2^+$ when they are accelerated by the same energy. Therefore, the increase in proportion of the $H_3^+$ ions included in the ion beam leads to reduction of variation in the average depth at which hydrogen ions enter; accordingly, in the bond substrate 108, the hydrogen concentration profile in the depth direction becomes steeper and the peak of the profile can be positioned at a small depth. Accordingly, it is preferable that $H_3^+$ be contained at 50% or more with respect to the total amount of $H^+$, $H_2^+$, and $H_3^+$ in the ion beam, and it is more preferable that the proportion of $H_3^+$ be 80% or more.

In the case of performing ion addition by an ion doping method using a hydrogen gas, the acceleration voltage can be set to a voltage equal to or more than 10 kV and equal to or less than 200 kV, and the dose can be set to a dose equal to or more than $1\times10^{16}$ ions/cm$^2$ and equal to or less than $6\times10^{16}$ ions/cm$^2$. By the addition of the hydrogen ions under this condition, the damaged region 110 can be formed at a depth equal to or more than 50 nm and equal to or less than 500 nm in the bond substrate 108, though depending on the ion species and their proportions in the ion beam.

Helium (He) can alternatively be used as the source gas of an ion beam 121. Most of the ion species generated by excitation of helium are $He^+$; therefore, addition with $He^+$ as main ions can be performed on the bond substrate 108 even by an ion doping method without mass separation. Therefore, microvoids can be formed in the damaged region 110 efficiently by an ion doping method. When ion addition is performed using helium by an ion doping method, the acceleration voltage can be set to a voltage equal to or more than 10 kV and equal to or less than 200 kV, and the dose can be set to a dose equal to or more than $1\times10^{16}$ ions/cm$^2$ and equal to or less than $6\times10^{16}$ ions/cm$^2$.

A halogen gas such as a chlorine gas ($Cl_2$ gas) or a fluorine gas ($F_2$ gas) can alternatively be used as the source gas.

After that, the base substrate 101 and the plane of the bond substrate 108 where the bonding layer 103 is formed are made in close contact with each other and bonded. A bonding layer formed of a silicon oxide film using organosilane as a raw material may be formed over the base substrate in advance. Silicon oxide deposited by a CVD method using organosilane as a raw material can form a film with a smooth surface; therefore, stronger bonding can be achieved upon bonding the semiconductor layer 102 to the base substrate 101.

As the base substrate 101, a substrate having electrical insulating properties or a substrate having an insulating surface can be used; for example, any of a variety of glass substrates that are used in the electronics industry, which are called non-alkali glass substrates, such as an aluminosilicate glass substrate, an aluminoborosilicate glass substrate, and a barium borosilicate glass substrate, can be used.

It is preferable that heat treatment be performed on the base substrate 101 in advance in order to prevent or reduce shrink caused by thermal treatment performed in the following step. The heat treatment may be performed as appropriate at a temperature which is equal to or lower than the glass-transition temperature of the base substrate 101, considering the temperature of the thermal treatment performed in the following step.

It is necessary that a plane where bonding is to be formed is cleaned sufficiently. This cleaning step can be performed by ultrasonic cleaning with purified water. Megahertz ultrasonic cleansing (megasonic cleaning) is preferably performed as the ultrasonic cleaning, and in this embodiment mode, the surface of the base substrate 101 and the surface of the bonding layer 103 over the bond substrate 108 are purified by megasonic cleaning. Furthermore, the surfaces are preferably cleaned with ozone water after the megasonic cleaning to remove an organic substance and improve the hydrophilicity of the surfaces.

In order to form good bonding, the plane which forms bonding may be activated in advance. For example, the plane which forms bonding is irradiated with an atom beam or an ion beam. In the case of utilizing an atom beam or an ion beam, a neutral atom beam or an ion beam of an inert gas such as argon can be used. Alternatively, plasma irradiation or radical treatment can be performed thereon. Such surface treatment facilitates formation of bonding between different materials even at temperatures of 200° C. to 400° C.

Figure 2A:
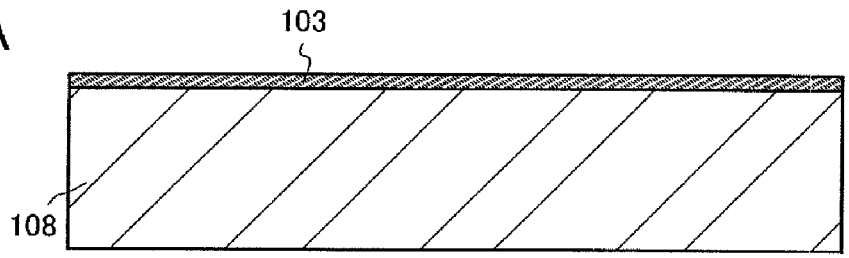
FIGS. 2A to 2D are diagrams describing a method for manufacturing a semiconductor substrate of the present invention.
Figure 2B:
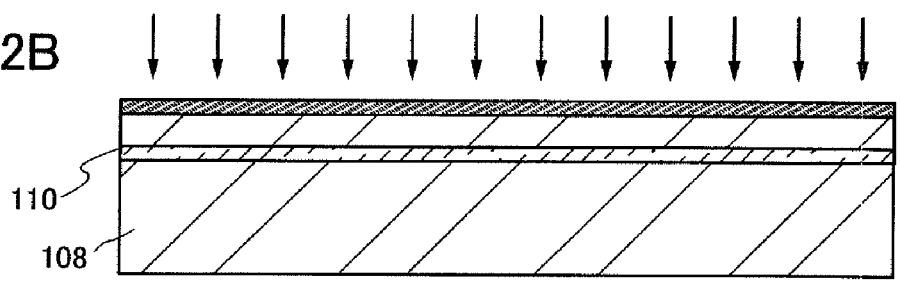
Figure 2C:
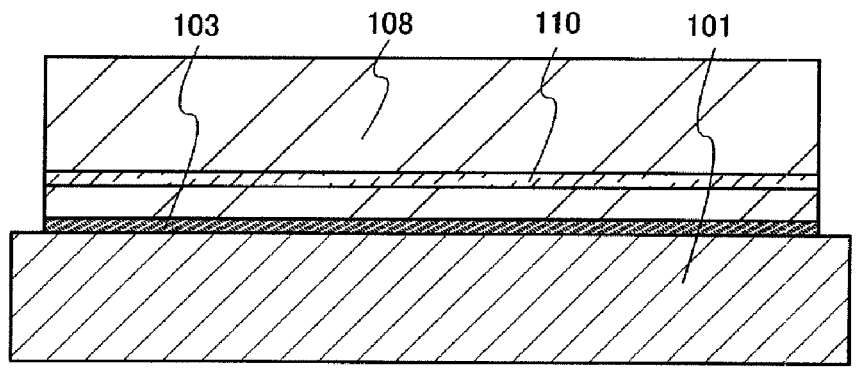

FIG. 2C illustrates a mode in which the base substrate 101 and the plane of the bond substrate 108 where the bonding layer 103 is formed are made in close contact with each other and bonded. Bonding is formed by making the base substrate 101 and the bonding layer 103 in close contact with each other. Van der Waals force acts on this bonding. In this case, by pressuring the base substrate 101 and the bond substrate 108, for bonding, respective bonding planes are made to be close to each other, so that the bonding by Van der Waals force can be shifted to hydrogen bonding that is stronger bonding. The pressuring for bonding may be performed by applying a pressure of 300 to 15000 N/cm$^2$ to one out of four corners of the substrates. It is preferable that this pressure be 1000 to 5000 N/cm$^2$. The one portion of the bonding planes, being in contact with each other, within the substrates makes adjacent region of the bonding planes in contact with each other to shift the bonding to hydrogen bonding, so that the bonding at the entire region of the bonding planes can be shifted to hydrogen bonding.

After that, it is preferable to perform heat treatment in order to improve the bonding strength at a bonding interface between the base substrate and the bonding layer. For example, thermal treatment is performed in a temperature condition of 70° C. to 350° C. (e.g., at 200° C. for 2 hours) with an oven, a furnace, or the like.

Figure 2D:
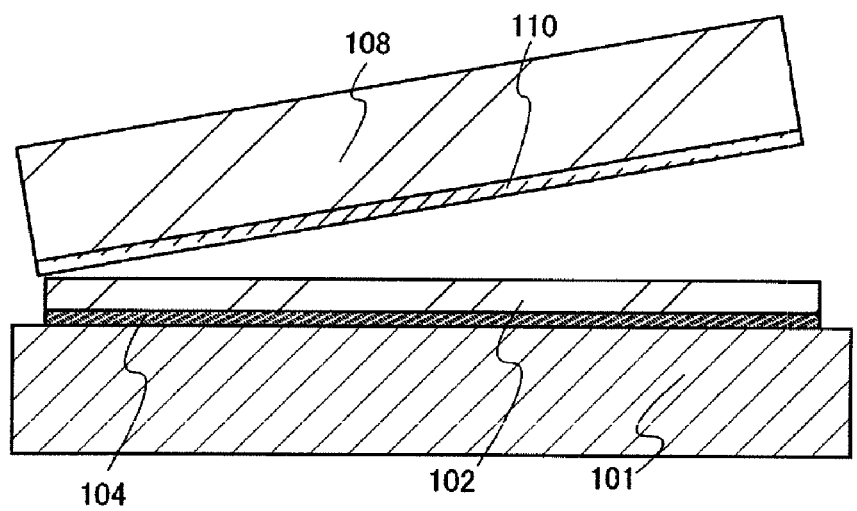
Figure 3:
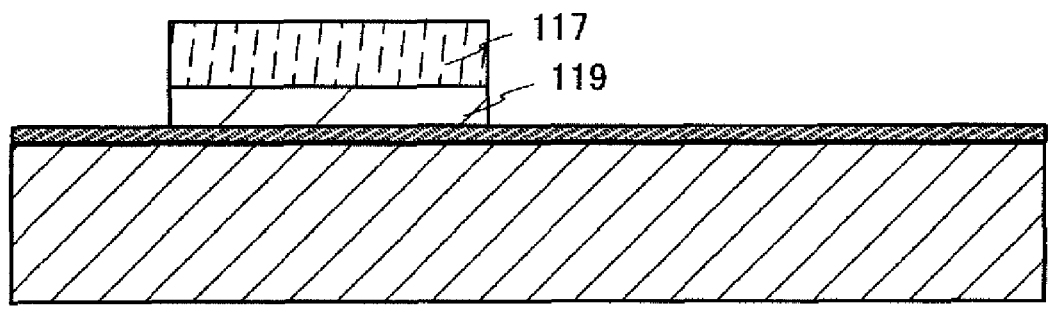
FIG. 3 is a diagram describing a method for manufacturing a semiconductor substrate of the present invention.

After the base substrate 101 and the bond substrate 108 are attached to each other, heat treatment is performed thereon to separate a part of the bond substrate 108 from the base substrate 101 at the damaged region 110 functioning as a cleavage plane (FIG. 2D). The heat treatment may be performed at a temperature below the distortion point of the base substrate. The volume of microvoids formed in the damaged region 110 is changed by the heat treatment, which leads to separation along the damaged region 110. After the thermal treatment is performed, the base substrate and the bond substrate can be separated at the cleavage plane without applying strong force. For example, an upper substrate is lifted with a vacuum chuck, so that the separation can be easily performed. At this time, a lower substrate may be fixed with a vacuum chuck or a mechanical chuck to prevent deviation in a horizontal direction.

The thermal treatment may be successively performed with the same equipment as the equipment which is used for the above thermal treatment for improving the bonding strength or with different equipment. For example, thermal treatment is performed with a furnace at 200° C. for 2 hours, the temperature is increased to the same or substantially the same temperature as 600° C. and held for 2 hours, the temperature is decreased to a temperature ranging from room temperature to 400° C., and then the substrate is taken out of the furnace. The thermal treatment may be performed with a temperature increasing from room temperature. Alternatively, thermal treatment may be performed with a furnace at 200° C. for 2 hours, and then thermal treatment may be performed at a temperature in a range of 600° C. to 700° C. with rapid thermal annealing (RTA) equipment for 1 minute to 30 minutes (e.g., at 600° C. for 7 minutes, or at 650° C. for 7 minutes).

This heat treatment can be performed with, as well as RTA (rapid thermal annealing) equipment, a resistance heating furnace or microwave heating equipment. As the RTA equipment, GRTA (gas rapid thermal anneal) equipment or LRTA (lamp rapid thermal anneal) equipment can be used.

With the use of GRTA equipment, the heat treatment can be performed at a temperature equal to or higher than 550° C. and equal to or lower than 650° C. for a processing time equal to or longer than 0.5 minutes and equal to or shorter than 60 minutes. With the use of resistance heating equipment, the heat treatment can be performed at a temperature equal to or higher than 200° C. and equal to or lower than 650° C. for a processing time equal to or longer than 2 hours and equal to or shorter than 4 hours. With the use of microwave heating equipment, the heat treatment can be performed by irradiation with microwaves at a frequency of 2.45 GHz for a processing time equal to or longer than 10 minutes and equal to or shorter than 20 minutes.

A specific processing method of the heat treatment with an upright furnace for performing resistance heating will be described. The base substrate 101 provided with the bond substrate 108 is put on a boat of the upright furnace. The boat is carried into a chamber of the upright furnace. In order to suppress oxidation of the bond substrate 108, the chamber is evacuated first such that a vacuum state is formed. The degree of vacuum is set to about $5 \times 10^{-3}$ Pa. After the vacuum state is achieved, nitrogen is supplied into the chamber such that the atmosphere of the chamber becomes a nitrogen atmosphere with an atmospheric pressure; in this period, the temperature is increased to 200° C.

After the nitrogen atmosphere with an atmospheric pressure is achieved in the chamber, heating is performed at 200° C. for 2 hours. After that, the temperature is increased to 400° C. in 1 hour. After the state where the heating temperature is 400° C. is stabled, the temperature is increased to 600° C. in 1 hour. After the state where the heating temperature is 600° C. is stabled, heat treatment is performed at 600° C. for 2 hours. After that, the heating temperature is decreased to 400° C. in 1 hour, and 10 to 30 minutes later, the boat is carried out of the chamber. Under an atmospheric pressure, the bond substrate 108 and the base substrate 101 to which the semiconductor layer 102 is attached, which are on the boat, are cooled.

By the above-described heat treatment with the resistance heating furnace, the heat treatment for increasing the bonding strength between the bonding layer 103 and the base substrate 101 and the heat treatment for causing separation at the damaged region 110 are carried out successively. In the case where the two heat treatments are performed with different equipment, they are performed as follows, for example. Heat treatment is performed at 200° C. for 2 hours with a resistance heating furnace, and then the base substrate 101 and the bond substrate 108 which are attached to each other are carried out of the furnace. Then, heat treatment is performed at a temperature equal to or higher than 600° C. and equal to or lower than 700° C. for a processing time equal to or longer than 1 minute and equal to or shorter than 30 minutes with RTA equipment, so that the bond substrate 108 is separated at the damaged region 110.

In order to strongly bond the bonding layer 103 and the base substrate 101 by low-temperature treatment at a temperature equal to or lower than 700° C., it is preferable that an OH radical or a water molecule ($H_2O$) exists on the surface of the bonding layer 103 or the surface of the base substrate 101. This is because bonding between the bonding layer 103 and the base substrate 101 starts from formation of a covalent bond (a covalent bond of an oxygen molecule and a hydrogen molecule) or a hydrogen bond by an OH radical or a water molecule.

Therefore, it is preferable that the surface of the bonding layer 103 or the base substrate 101 be activated to be hydrophilic. It is preferable that the bonding layer 103 be formed by a method so as to contain oxygen or hydrogen.

Note that the reason why the treatment at a process temperature equal to or lower than 700° C. is called low-temperature treatment is that the process temperature is lower than the strain point of a glass substrate. In contrast, in the case of a semiconductor substrate formed by Smart-Cut (registered trademark), heat treatment at a temperature above the strain point of a glass substrate is needed since heat treatment at a temperature equal to or higher than 800° C. is performed to attach a single crystal silicon layer and a single crystal silicon wafer.

Through the above process, as shown in FIG. 1A, the bonding layer 103 is provided over the base substrate 101, which is a substrate having an insulating surface, and the semiconductor layer 102, which is separated from the bond substrate 108, is formed.

In this embodiment mode, an ion-implantation separation method in which hydrogen, helium, or fluorine is added at a given depth of the bond substrate, and then thermal treatment is performed to separate off the semiconductor layer which is a surface layer is employed for forming an SOI layer over the base substrate 101; and alternatively, a method may be employed in which single crystal silicon is epitaxially grown over porous silicon and a porous silicon layer is separated off by cleavage by water jetting.

Note that the semiconductor layer 102 which is separated from the bond substrate and disposed over the base substrate may have problems in that crystal defects are caused and the surface flatness is damaged so that roughness is formed by the separation step and the ion addition step. When a transistor is manufactured as a semiconductor element using a semiconductor layer, it is difficult to form a thin gate insulating layer with high withstand voltage over a top surface of such a semiconductor layer with roughness. In addition, a crystal defect in the semiconductor layer adversely affects performance and reliability of the transistor; for example, the localized interface state density between the semiconductor layer and the gate insulating layer is increased.

Therefore, it is preferable that the semiconductor layer 102 be scanned and irradiated with electromagnetic waves such as laser light to reduce the crystal defects. By the irradiation with electromagnetic waves, part of the semiconductor layer or the entire layer in the depth direction is melted and recrystallized so that crystal defects in the semiconductor layer can be reduced. In addition, the melting enables the degree of surface flatness of the semiconductor layer 102 to be improved by a surface tension effect. Note that an oxide (a native oxide or a chemical oxide) formed on the surface of the semiconductor layer is preferably removed with dilute hydrofluoric acid before the irradiation with electromagnetic waves.

Any electromagnetic waves may be used as long as they can provide high energy to the semiconductor layer; preferably, a laser beam can be used.

The energy supply to the semiconductor layer can also be performed by colliding particles having high energy with the semiconductor layer and by, mainly, heat conduction. As a heat source for supplying particles having high energy, plasma can be used; normal-pressure plasma, high-pressure plasma, a thermal plasma jet, or a flame of a gas burner, or the like can be used. As another example of the heat source, an electron beam or the like can be given.

Wavelengths of the electromagnetic waves are wavelengths that are absorbed by the semiconductor layer. The wavelengths can be determined by considering the skin depth of electromagnetic waves or the like. For example, electromagnetic waves with wavelengths of 190 to 600 nm can be used. In addition, electromagnetic wave energy can be determined considering the wavelengths of electromagnetic waves, the skin depth of electromagnetic waves, the thickness of the semiconductor layer to be irradiated, or the like.

As a laser for emitting the laser beam, a continuous wave laser, a pseudo continuous wave laser, or a pulsed laser can be used. A pulsed laser is preferably used because the semiconductor layer is partially melted. For example, an excimer laser such as a KrF laser, or a gas laser such as an Ar laser or a Kr laser can be used. Alternatively, as a solid state laser, a YAG laser, a YVO$_4$ laser, a YLF laser, a YAlO$_3$ laser, a GdVO$_4$ laser, a KGW laser, a KYW laser, an Alexandrite laser, a Ti:sapphire laser, a Y$_2$O$_3$ laser, or the like can be used. An excimer laser is a pulsed laser, and some solid lasers such as a YAG laser can be used as any of a continuous laser, a pseudo continuous laser, and a pulsed laser Note that in the solid laser, it is preferable to employ the second to fifth harmonics of a fundamental wave. Alternatively, a semiconductor laser such as GaN, GaAs, GaAlAs, or InGaAsP can be used.

Alternatively, as long as the semiconductor layer can be irradiated with electromagnetic wave energy, lamp light may be used. For example, light emitted from an ultraviolet lamp, a black light, a halogen lamp, a metal halide lamp, a xenon arc lamp, a carbon arc lamp, a high pressure sodium lamp, or a high pressure mercury lamp may be used. Flash annealing using the above-described lamp light may be performed. Flash annealing performed desirably using a halogen lamp, a xenon lamp, or the like requires very short processing time, and thus increase in temperature of the base substrate can be suppressed.

An optical system including a shutter, a reflector such as a mirror or a half mirror, a cylindrical lens or a convex lens, etc. may be provided to adjust the shape or path of the electromagnetic waves.

As for the irradiation method of electromagnetic waves, electromagnetic waves may be selectively emitted, or light (electromagnetic waves) may be emitted by scanning with light (electromagnetic waves) in the XY directions. In this case, it is preferable that a polygon mirror or a galvanometer mirror be used in the optical system.

The irradiation with electromagnetic waves can be performed in an atmosphere containing oxygen such as an atmospheric atmosphere or in an inert atmosphere which is filled with an inert gas such as nitrogen. To perform the irradiation with electromagnetic waves in an inert atmosphere, irradiation with electromagnetic waves may be performed in an airtight chamber, and the atmosphere in this chamber may be controlled. The nitrogen atmosphere can also be formed by spraying an inert gas such as a nitrogen gas on a plane to be irradiated with the electromagnetic waves. It is preferable that the inert gas has been heated. The inert gas being heated at a temperature equal to or higher than 50° C. can suppress a drop in surface temperature of the semiconductor layer 102 sprayed with the gas. It is preferable that the heating temperature of the inert gas be equal to or higher than 250° C. and equal to or lower than 670° C. The inert gas being heated at a temperature equal to or higher than 250° C. can heat the semiconductor layer 102. Consequently, shortage of energy of electromagnetic waves for the irradiation can be supplied so that the range of applicable energy of electromagnetic waves can be widened. It is more preferable that the heating temperature be equal to or higher than 450° C. and equal to or lower than 625° C. Further, by irradiating the semiconductor layer 102 with electromagnetic waves while spraying with the heated gas, the period of time during which the semiconductor layer 102 is melted is prolonged so that higher effect of decreasing defects and effect of flattening can be provided. As the inert gas, a rare gas such as nitrogen, argon, or xenon can be used. It is preferable that the oxygen concentration in the inert gas be equal to or less than 10 ppm.

Before the semiconductor layer 102 is irradiated with electromagnetic waves, the surface of the semiconductor layer 102 may be etched. It is preferable that the damaged region 110 left on the separation plane of the semiconductor layer 102 be removed by this etching. Removal of the damaged region 110 enables the effect of flattering and effect of recrystallizing of the surface by the irradiation with electromagnetic waves to be improved.

After the semiconductor layer 102 is irradiated with electromagnetic waves, the semiconductor layer 102 may be etched to be thinned. The thickness of the semiconductor layer 102 can be determined in accordance with the characteristics of an element to be formed. In order to form a thin gate insulating layer on the surface of the single crystal semiconductor layer 102 attached to the base substrate 101, with good coverage, it is preferable that the thickness of the semiconductor layer 102 be equal to or less than 50 nm; the thickness may be equal to or less than 50 nm and equal to or more than 5 nm.

Dry etching or wet etching can be performed as the etching. In the dry etching, a chloride gas such as boron chloride, silicon chloride, or carbon tetrachloride, a chlorine gas, a fluoride gas such as sulfur fluoride or nitrogen fluoride, an oxygen gas, or the like can be used as an etching gas. In the wet etching, tetramethylammonium hydroxide (TMAH) solution can be used as an etchant.

Polishing treatment may be performed on the semiconductor layer 102. The polishing treatment can improve the degree of surface flatness of the semiconductor layer.

For the polishing treatment, a chemical mechanical polishing (CMP) method or a liquid jet polishing method can be used. Note that the surface of the semiconductor layer is cleaned to be purified before the polishing treatment. The cleaning may be performed by megasonic cleaning, two-fluid jet cleaning, or the like; and dust or the like on the surface of the semiconductor layer is removed by the cleaning. In addition, it is preferable to remove a native oxide or the like on the surface of the semiconductor layer with dilute hydrofluoric acid to expose the semiconductor layer.

In addition, polishing treatment (or etching treatment) may be performed on the surface of the semiconductor layer before the irradiation with electromagnetic waves.

Subsequently, a mask 117 is formed over the semiconductor layer 102 provided over the base substrate 101, and etching treatment is performed with the mask 117 to process the semiconductor layer 102, thereby forming an island-shaped semiconductor layer 119. In FIGS. 4A to 4E, an insulating layer formed under a semiconductor layer is not etched by the etching treatment for forming the semiconductor layer 119; however, the insulating layer may be etched by the etching treatment of the semiconductor layer 119. In the latter case, the insulating layer reflects the island shape of the semiconductor layer 119 to be provided only just below the semiconductor layer 119.

In this embodiment mode, when a single crystal silicon substrate is used as the bond substrate 108, a single crystal silicon layer can be obtained as a semiconductor layer 130. In addition, a method for manufacturing a semiconductor substrate in this embodiment mode permits the process temperature to be reduced to equal to or less than 700° C.; hence, a glass substrate can be used as the base substrate 101. That is, similarly to a conventional thin film transistor, a transistor can be formed over a glass substrate and a single crystal silicon layer can be used for the semiconductor layer. By using, as the bonding layer 103, a film made of one or more of kinds of PSG, BSG, and BPSG formed by a thermal CVD method using an organosilane gas at a temperature equal to or more than 500° C. and equal to or less than 800° C., diffusion of highly mobile impurity ions from the base substrate 101 into the semiconductor layer 130 can be prevented. Accordingly, a highly reliable semiconductor element with stable characteristics can be provided. Further, since the bonding layer 103 also functions as a blocking layer for preventing diffusion of highly mobile impurity ions into the semiconductor layer, increase of the number of manufacturing steps and a drop in yield can be reduced.

According to this, a transistor with stable operation and high performance such as high speed operation, high field-effect mobility, and low voltage driving can be manufactured even over a base substrate which is thermally fragile and contains highly mobile elements which adversely affect a semiconductor layer, such as a glass substrate. At the same time, increase in the number of manufacturing steps and drop in yield can be suppressed.

Although the bond substrate 108 is smaller than the base substrate 101 in FIGS. 1A and 1B, FIGS. 2A to 2D, FIG. 3, and FIGS. 4A to 4E, the present invention is not limited thereto; that is, the bond substrate 108 and the base substrate 101 may be the same size or the bond substrate 108 may be larger than the base substrate 101.

By using the method in this embodiment mode, a plurality of the semiconductor layers 102 can be attached to the base substrate 101. By attaching a plurality of the bond substrates 108 to the base substrate 101 and performing the above-described process thereon, a substrate including the base substrate 101 to which the plurality of semiconductor layers 102 is attached can be manufactured.

When the substrate including the base substrate 101 to which the plurality of semiconductor layers 102 is attached is manufactured, it is preferable to use a glass substrate having an area equal to or larger than the area of 300 mm×300 mm as the base substrate 101. As the large glass substrate, a mother glass developed for manufacturing of liquid-crystal panels is preferable. As the mother glass, substrates with the following sizes are known: 3rd generation (550 mm×650 mm); 3.5th generation (600 mm×720 mm); 4th generation (680 mm×880 mm or 730 mm×920 mm); 5th generation (1100 mm×1300 mm); 6th generation (1500 mm×1850 mm); 7th generation (1870 mm×2200 mm); and 8th generation (2200 mm×2400 mm).

A large substrate such as a mother glass being used as the base substrate 101 enables the area of a semiconductor substrate to be increased. With the achievement of increase of are of the semiconductor substrate, many chips of ICs, LSIs, etc. can be manufactured from one semiconductor substrate, so that the number of chips manufactured from one substrate is increased; thus, productivity can be dramatically improved.

Embodiment Mode 2

In this embodiment mode, a CMOS (complementary metal oxide semiconductor) will be described as an example of the semiconductor device of the present invention, using FIGS. 4A to 4E and FIGS. 5A to 5D. A method for manufacturing the semiconductor device will be described at the same time. According to this embodiment mode, a CMOS is manufactured using the semiconductor substrate described in Embodiment Mode 1 so that a CMOS with high performance and stable operation can be provided. Note that repetitive description for the same components as or components having similar functions to the components in Embodiment Mode 1 is omitted.

Figure 4A:
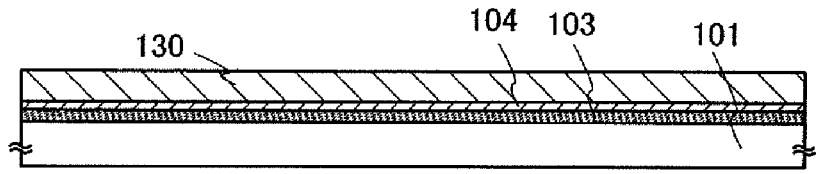
FIGS. 4A to 4E are diagrams describing a method for manufacturing a semiconductor device of the present invention.

In FIG. 4A, the bonding layer 103, the barrier layer 104, and the semiconductor layer 130 are formed over the base substrate 101. Although the semiconductor substrate in which the barrier layer 104 for preventing one or both of phosphorus and boron contained in the bonding layer 103 from diffusing into the semiconductor layer is provided in this embodiment mode, any semiconductor substrate having another structure described in this specification can also be used in the present invention.

The bonding layer 103 is formed of a film of at least one kind of PSG, BSG, and BPSG deposited by a thermal CVD method using organosilane at a temperature equal to or higher than 500° C. and equal to or lower than 800° C. The film deposition can form a layer having a smooth surface as the bonding layer 103 and strong bonding can be obtained at a relatively low temperature, so that the semiconductor layer 130 can be bonded strongly to the base substrate 101 made of a material which is thermally fragile such as glass. Further, diffusion of highly mobile impurity ions from the base substrate 101 into the semiconductor layer 130 can be prevented, so that a semiconductor element with stable characteristics can be provided. Further, since the bonding layer 103 also functions as a blocking layer for preventing diffusion of highly mobile impurity ions into the semiconductor layer, increase of the number of manufacturing steps and a drop in yield can be reduced.

To the semiconductor layer 130, a p-type impurity element such as boron, aluminum, or gallium or an n-type impurity element such as phosphorus or arsenic is preferably added in accordance with each formation region of an n-channel field-effect transistor and a p-channel field-effect transistor. That is, the p-type impurity element is added to the formation region of an n-channel field-effect transistor and the n-type impurity is added to the formation region of a p-channel field-effect transistor, whereby so-called well regions are formed. The dose of impurity ions may be about equal to or more than $1\times10^{12}$ ions/cm$^2$ and equal to or less than $1\times10^{14}$ ions/cm$^2$. Furthermore, in the case of controlling the threshold voltage of the field-effect transistor, a p-type impurity element or an n-type impurity element may be added into the well region.

Figure 4B:
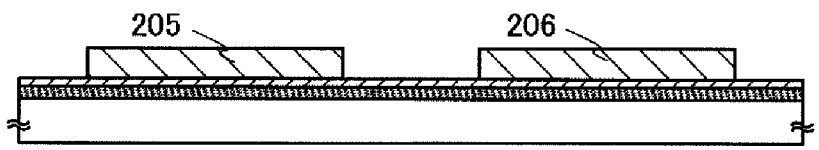

First, the semiconductor layer 130 is etched to form a semiconductor layer 205 and a semiconductor layer 206 which are separated into island shapes in accordance with arrangement of semiconductor elements (see FIG. 4B).

An oxide formed on the semiconductor layer naturally (not shown) is removed, and a gate insulating layer 207 that covers the semiconductor layers 205 and 206 is formed.

The gate insulating layer 207 may be formed of silicon oxide or a stacked-layer structure of silicon oxide and silicon nitride. The gate insulating layer 207 may be formed by depositing an insulating film by a plasma CVD method or a low-pressure CVD method or may be formed by solid phase oxidation or solid phase nitridation with plasma treatment. This is because a gate insulating layer which is formed by oxidizing or nitriding a semiconductor layer with plasma treatment is dense, has high withstand voltage, and is excellent in reliability.

Alternatively, as the gate insulating layer 207, a high permittivity material such as zirconium dioxide, hafnium oxide, titanium dioxide, or tantalum pentoxide may be used. Using of the high permittivity material for the gate insulating layer 207 enables gate leakage current to decrease.

Figure 4C:
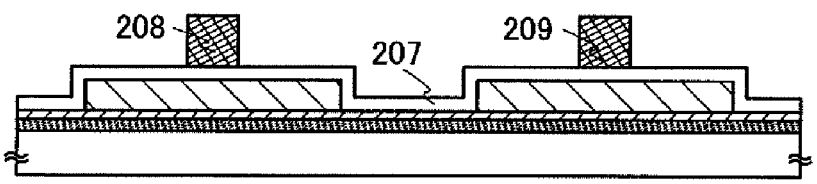
Figure 4D:
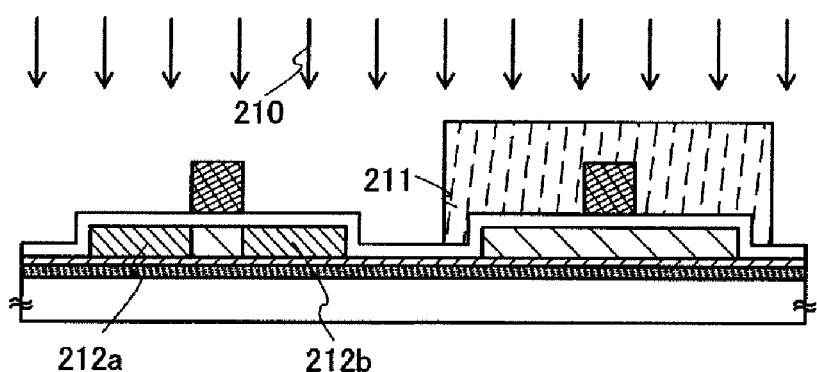
Figure 4E:
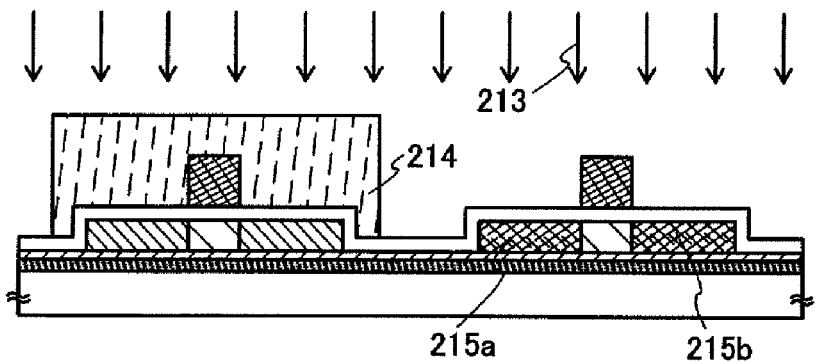

Next, a gate electrode layer 208 and a gate electrode layer 209 are formed over the gate insulating layer 207 (see FIG. 4C). The gate electrode layers 208 and 209 can be formed by a sputtering method, an evaporation method, a CVD method, or the like. The gate electrode layers 208 and 209 may be each formed of an element selected from tantalum (Ta), tungsten (W), titanium (Ti), molybdenum (Mo), aluminum (Al), copper (Cu), chromium (Cr), and neodymium (Nd); or an alloy material or a compound material that contains any of these elements as its main component. Alternatively, as each of the gate electrode layers 208 and 209, a semiconductor film typified by a polycrystalline silicon film doped with an impurity element such as phosphorus, or an AgPdCu alloy may be used.

Then, a mask 211 that covers the semiconductor layer 206 is formed. Using the mask 211 and the gate electrode layer 208 as masks, an impurity element 210 which imparts n-type conductivity is added to form first n-type impurity regions 212a and 212b (see FIG. 4D). In this embodiment mode, phosphine (PH$_3$) is used as a doping gas containing an impurity element. In this embodiment mode, doping is performed so that the first n-type impurity regions 212a and 212b each contain the impurity element which imparts n-type conductivity at a concentration of about $1\times10^{17}$ to $5\times10^{18}$/cm$^3$. In this embodiment mode, phosphorus (P) is used as the impurity element which imparts n-type conductivity.

Next, a mask 214 that covers the semiconductor layer 205 is formed. Using the mask 214 and the gate electrode layer 209 as masks, an impurity element 213 which imparts p-type conductivity is added to form first p-type impurity regions 215a and 215b (see FIG. 4E). In this embodiment mode, boron (B) is used as the impurity element, and thus diborane (B$_2$H$_6$) or the like is used as a doping gas containing an impurity element.

Figure 5A:
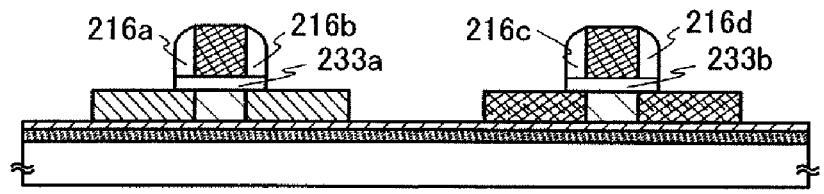
FIGS. 5A to 5D are diagrams describing a method for manufacturing a semiconductor device of the present invention.
Figure 5B:
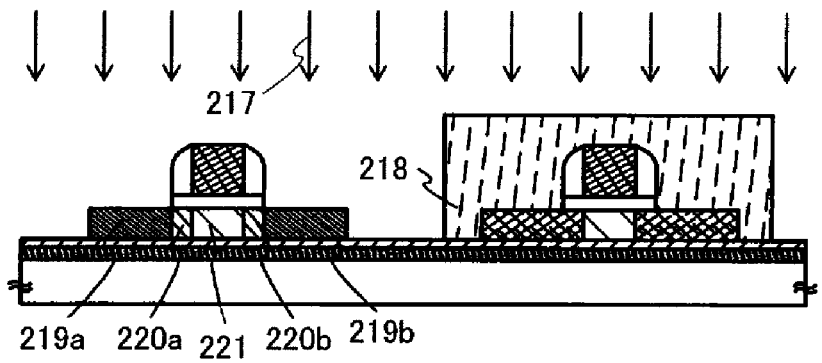
Figure 5C:
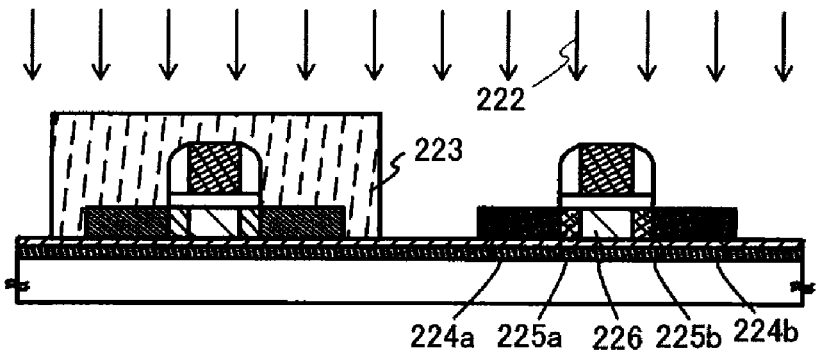

The mask 214 is removed, sidewall insulating layers 216a to 216d with sidewall structures are formed on side surfaces of the gate electrode layers 208 and 209, and gate insulating layers 233a and 233b are formed (see FIG. 5A). The sidewall insulating layers 216a to 216d with sidewall structures may be formed on the side surfaces of the gate electrode layers 208 and 209 in a self-aligned manner, by the following manner: an insulating layer that covers the gate electrode layers 208 and 209 is formed and is processed by anisotropic etching with an RIE (reactive ion etching) method. In the present invention, there is no particular limitation on the insulating layers; and preferably, the insulating layers are made of silicon oxide with favorable step coverage, which are formed by reacting TEOS (tetraethyl ortho-silicate), silane, or the like with oxygen, nitrous oxide, or the like. The insulating layers can be formed by a thermal CVD method, a plasma CVD method, an atmospheric pressure CVD method, a bias ECR CVD method, a sputtering method, or the like. The gate insulating layers 233a and 233b can be formed by, using the gate electrode layers 208 and 209 and the sidewall insulating layers 216a to 216d as masks, etching the gate insulating layer 207.

Although in this embodiment mode, in etching the insulating layer, the insulating layers over the gate electrode layers are removed to expose the gate electrode layers, the sidewall insulating layers 216a to 216d may be formed to have a shape in which the insulating layers over the gate electrode layers remain. A protective film may be formed over the gate electrode layers in a later step. By protecting the gate electrode layers in such a manner, film reduction of the gate electrode layers can be prevented in an etching processing. In the case where silicide is formed over a source and drain regions, a metal film formed for the formation of silicide is not contact with the gate electrode layers; and therefore, even when a material of the metal film might easily react with a material of the gate electrode layer, defects such as chemical reaction and diffusion can be prevented. Various etching methods such as a dry etching method and a wet etching method may be used for the etching. In this embodiment mode, dry etching is used. Note that an etching gas can be selected as appropriate from among a chlorine-based gas typified by Cl$_2$, BCl$_3$, SiCl$_4$, or CCl$_4$; a fluorine-based gas typified by CF$_4$, SF$_6$, or NF$_3$; and O$_2$.

Next, a mask 218 that covers the semiconductor layer 206 is formed. Using the mask 218, the gate electrode layer 208, and the sidewall insulating layers 216a and 216b as masks, an impurity element 217 which imparts n-type conductivity is added to form second n-type impurity regions 219a and 219b and third n-type impurity regions 220a and 220b. In this embodiment mode, PH$_3$ is used as a doping gas containing an impurity element. In this embodiment mode, the doping is performed so that the second n-type impurity regions 219a and 219b each contain the impurity element which imparts n-type conductivity at a concentration of about $5\times10^{19}$ to $5\times10^{20}$/cm$^3$. In addition, a channel formation region 221 is formed in the semiconductor layer 205 (see FIG. 5B).

The second n-type impurity regions 219a and 219b are high-concentration n-type impurity regions and function as a source and a drain. On the other hand, the third n-type impurity regions 220a and 220b are low-concentration impurity regions, or LDD (lightly doped drain) regions. The third n-type impurity regions 220a and 220b, which are formed in Loff regions which are not covered with the gate electrode layer 208, enables off current to reduce. Accordingly, a semiconductor device with higher reliability and lower power consumption can be manufactured.

The mask 218 is removed, and a mask 223 that covers the semiconductor layer 205 is formed. Using the mask 223, the gate electrode layer 209, and the sidewall insulating layers 216c and 216d as masks, an impurity element 222 which imparts p-type conductivity is added to form second p-type impurity regions 224a and 224b and third p-type impurity regions 225a and 225b.

The doping is performed so that the second p-type impurity regions 224a and 224b each contain the impurity element which imparts p-type conductivity at a concentration of about $1 \times 10^{20}$ to $5 \times 10^{21}/cm^3$. In this embodiment mode, the third p-type impurity regions 225a and 225b are formed in a self-aligning manner by the sidewall insulating layers 216c and 216d so as to have lower concentrations than the second p-type impurity regions 224a and 224b. In addition, a channel formation region 226 is formed in the semiconductor layer 206 (see FIG. 5C).

The second p-type impurity regions 224a and 224b are high-concentration p-type impurity regions and function as a source and a drain. On the other hand, the third p-type impurity regions 225a and 225b are low-concentration impurity regions, or LDD (lightly doped drain) regions. The third p-type impurity regions 225a and 225b which are formed in Loff regions which are not covered with the gate electrode layer 209, enables off current to reduce. Accordingly, a semiconductor device with higher reliability and lower power consumption can be manufactured.

The mask 223 is removed. Then, heat treatment, strong light irradiation, or laser beam irradiation may be performed in order to activate the impurity elements; in this case, at the same time as the activation, plasma damage to the gate insulating layer and plasma damage to the interface between the gate insulating layer and the semiconductor layer can be recovered.

Next, an interlayer insulating layer that covers the gate insulating layers and the gate electrode layers is formed. In this embodiment mode, a stacked-layer structure of a hydrogen-containing insulating film 227 which serves as a protective film and an insulating layer 228 is employed. The insulating film 227 and the insulating layer 228 may be formed of a silicon nitride film, a silicon nitride oxide film, a silicon oxynitride film, or a silicon oxide film by a sputtering method or a plasma CVD method. Alternatively, a single layer structure or a stacked-layer structure of three or more layers using another silicon-containing insulating film may be employed.

Further, heat treatment is performed in a nitrogen atmosphere at 300° C. to 550° C. for 1 to 12 hours to hydrogenate the semiconductor layers. Preferably, this step is performed at 400° C. to 500° C. This step allows a dangling bond of each semiconductor layer to be terminated by hydrogen contained in the insulating film 227 included in the interlayer insulating layer. In this embodiment mode, heat treatment is performed at 410° C. for 1 hour.

Each of the insulating film 227 and the insulating layer 228 can also be formed of a material selected from aluminum nitride (AlN), aluminum oxynitride (AlON), aluminum nitride oxide having a higher content of nitrogen than oxygen (AlNO), aluminum oxide, diamond-like carbon (DLC), nitrogen-containing carbon (CN), or another substance containing an inorganic insulating material. A siloxane resin may be used as well. Note that the siloxane resin corresponds to a resin containing a Si—O—Si bond. Siloxane is composed of a skeleton structure formed by the bond of silicon (Si) and oxygen (O). As a substituent, an organic group (e.g., an alkyl group or an aryl group) or a fluoro group may be used. The organic group may have a fluoro group. Alternatively, an organic insulating material such as polyimide, acrylic, polyamide, polyimide amide, resist, benzocyclobutene, or polysilazane can be used. A coating film with high degree of flatness may be formed by a coating method.

The insulating film 227 and the insulating layer 228 can be formed by dipping, spray coating, a doctor knife, a roll coater, a curtain coater, a knife coater, a CVD method, an evaporation method, or the like. The insulating film 227 and the insulating layer 228 may also be formed by a droplet discharge method. In the case of using a droplet discharge method, a material solution can be saved. Alternatively, a method like a droplet discharge method by which a pattern can be transferred or drawn, such as a printing method (a method for forming a pattern such as screen printing or offset printing), or the like can be used.

Next, contact holes (openings) which reach the semiconductor layers are formed in the insulating film 227 and the insulating layer 228, using a mask made of a resist. Etching may be performed once or a plurality of times depending on a selection ratio of a material to be used. The insulating film 227 and the insulating layer 228 are partly removed by the etching so that the openings which reach the second n-type impurity regions 219a and 219b and the second p-type impurity regions 224a and 224, which are source and drain regions are formed. For the etching, one or both of wet etching and dry etching may be employed. As an etchant of wet etching, a hydrofluoric-acid-based solution such as a mixed solution of ammonium hydrogen fluoride and ammonium fluoride may be used. An etching gas can be selected as appropriate from among a chlorine-based gas typified by $Cl_2$, $BCl_3$, $SiCl_4$, or $CCl_4$; a fluorine-based gas typified by $CF_4$, $SF_6$, or $NF_3$; and $O_2$. Further, an inert gas may be added to the etching gas. As an inert element to be added, one or a plurality of kinds selected from He, Ne, Ar, Kr, or Xe can be used.

A conductive film is formed so as to cover the openings, and the conductive film is etched to form wiring layers 229a, 229b, 230a, and 230b which function as source and drain electrode layers which are electrically connected to parts of the source and drain regions. The wiring layers can be formed by forming a conductive film by a PVD method, a CVD method, an evaporation method, or the like and then etching the conductive film into a desired shape. Alternatively, a conductive layer can be selectively formed in given positions by a droplet discharge method, a printing method, an electrolytic plating method, or the like. Further alternatively, a reflow method or a damascene method may be used. As a material for the wiring layers, metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. Further, a stacked-layer structure thereof may be used.

Figure 5D:
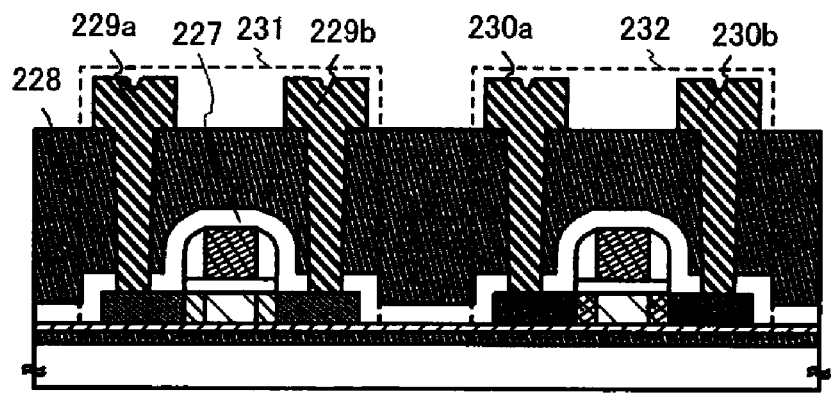

Through the above process, a semiconductor device including a CMOS structure which includes a thin film transistor 231, which is an n-channel thin film transistor, and a thin film transistor 232, which is a p-channel thin film transistor, can be manufactured (see FIG. 5D). Although not shown in the drawings, the thin film transistor 231 and the thin film transistor 232 are electrically connected to each other since the CMOS structure is employed in this embodiment mode.

The present invention is not limited to this embodiment mode; the thin film transistor may have a single gate structure, in which one channel formation region is formed, a double gate structure, in which two channel formation regions are formed, or a triple gate structure, in which three channel formation regions are formed.

As described above, according to this embodiment mode, a semiconductor element with stable operation and high performance such as high speed operation, high field-effect mobility, and low voltage driving can be manufactured even over a base substrate which is thermally fragile and contains highly mobile elements which adversely affect a semiconductor layer, such as a glass substrate. At the same time, increase in the number of manufacturing steps and drop in yield can be suppressed.

Embodiment Mode 3

In this embodiment mode, a liquid crystal display device will be described as an example of the semiconductor device of the present invention, using FIGS. 6A and 6B. According to this embodiment mode, a liquid crystal display device is manufactured using the semiconductor substrate described in Embodiment Mode 1 so that a liquid crystal display device with high performance and stable operation can be provided.

Figure 6A:
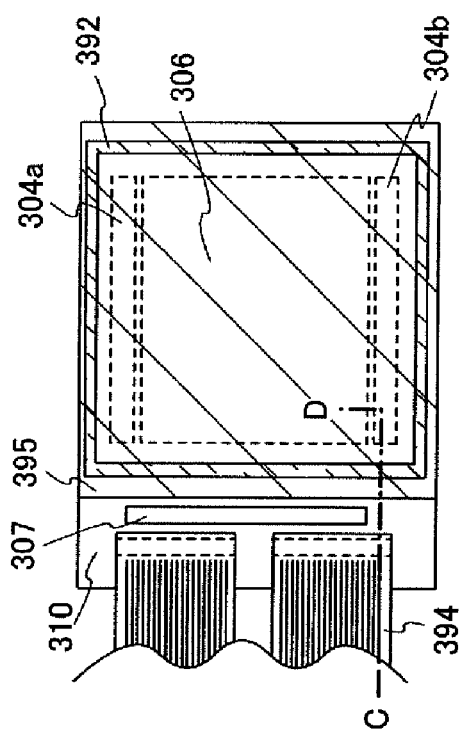
FIGS. 6A and 6B are diagrams describing a semiconductor device of the present invention.
Figure 6B:
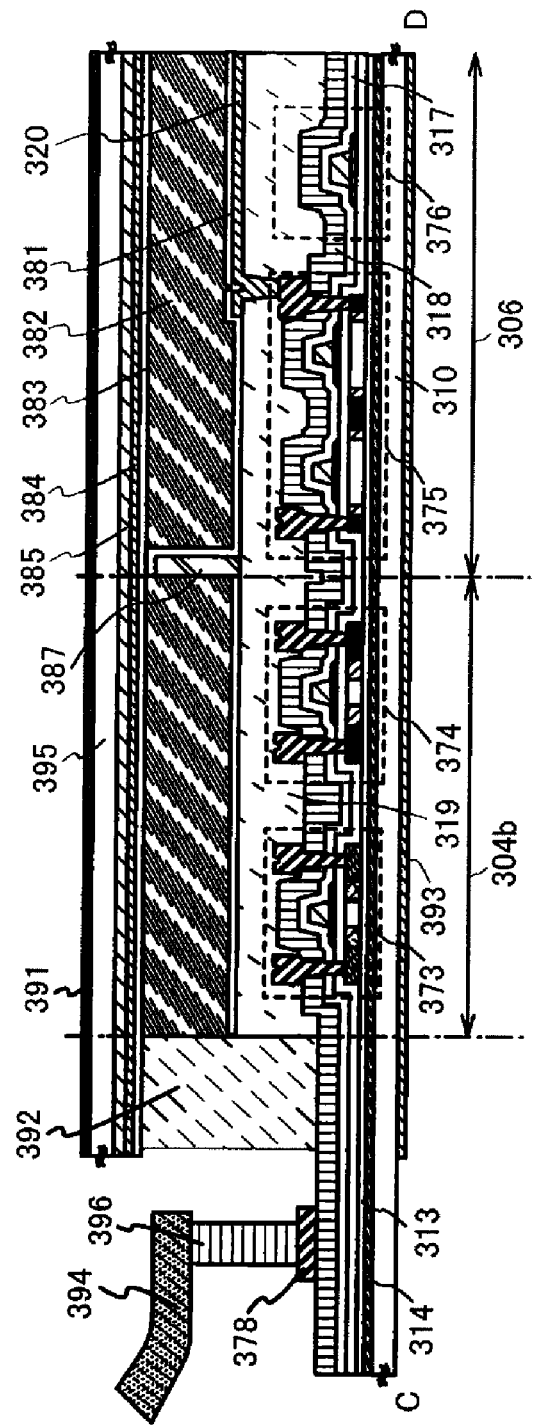

FIG. 6A is a top view of the liquid crystal display device, and FIG. 6B is a cross-sectional view of FIG. 6A taken along line C-D.

As shown in FIG. 6A, a pixel region 306 and driver circuit regions 304a and 304b which are scanning line driver circuits are sealed between a base substrate 310 and a counter substrate 395 with a sealant 392. A driver circuit region 307 which is a signal line driver circuit including a driver IC is provided over the base substrate 310. A transistor 375 and a capacitor 376 are provided in the pixel region 306. A driver circuit including transistors 373 and 374 is provided in the driver circuit region 304b. In the liquid crystal display device in this embodiment mode, a semiconductor element is manufactured as described in Embodiment Mode 2, using the semiconductor substrate described in Embodiment Mode 1. Accordingly, even in the case of a liquid crystal display device using a light-transmitting substrate, i.e., a glass substrate, a single crystal semiconductor layer can be used as a semiconductor layer of a semiconductor element so that a high-performance semiconductor element can be formed, and contamination from the glass substrate can be prevented so that a semiconductor element with stable operation can be formed. Consequently, a pixel region and a driver circuit region requiring high speed operation can be formed over the same substrate. In this case, transistors in the pixel region 306 and transistors in the driver circuit regions 304a and 304b are formed at the same time. The driver circuit region 307 may also be formed over the same substrate.

In the pixel region 306, the transistor 375 which serves as a switching element is provided over the base substrate 310 with a bonding layer 314 and a barrier layer 313 interposed therebetween. In this embodiment mode, a multi-gate thin film transistor (TFT) is used as the transistor 375. The transistor 375 includes a semiconductor layer including impurity regions that serve as a source region and a drain region, a gate insulating layer, a gate electrode layer having a stacked structure of two layers, insulating films 317 and 318 which are formed covering them, and a source electrode layer and a drain electrode layer which are formed over the insulating films 317 and 318. The source electrode layer and the drain electrode layer are connected to the impurity regions of the semiconductor layer, and either one of them is also electrically connected to an electrode layer 320 which is also called a pixel electrode layer, used in a display element.

An insulating film 319 is formed between the electrode layer 320 and any of a source electrode, a drain electrode, and the insulating film 318 to improve the degree of flatness. The insulating film 319 can be formed of an organic material or an inorganic material, and a stacked-layer structure of them can be employed. An insulating layer 381 which serves as an alignment film is formed over the electrode layer 320 and the insulating film 319.

The counter substrate 395 is provided with a coloring layer 385 which serves as a color filter, an electrode layer 384 which is also called a counter electrode layer, used in a display element, an insulating layer 383 which serves as an alignment film, and a polarizer (also called a polarizing plate) 391. The counter substrate 395 is attached to the base substrate 310 which is a TFT substrate with the sealant 392, with a spacer 387 interposed therebetween. A liquid crystal layer is provided between the insulating layer 381 and the insulating layer 383 which serve as alignment films. The semiconductor device in this embodiment mode is a transmissive type, and thus a polarizer (also called a polarizing plate) 393 is also provided on the side of the base substrate 310, opposite to the side where elements are provided. The polarizer can be provided for the substrate by using an adhesive layer. Filler may be mixed in the sealant, and the counter substrate 395 may be provided with a shielding film (a black matrix) or the like. When the liquid crystal display device is formed to be a full-color display device, the color filter or the like may be formed of materials which emit red (R), green (G), and blue (B) light. An anti-reflective film having an antireflective function may be provided on the viewing side of the semiconductor device. A retardation plate may be stacked between the polarizing plate and the liquid crystal layer.

Note that the color filter is not provided in some cases where light-emitting diodes (LEDs) of RGB or the like are arranged as a backlight and a successive additive color mixing method (field sequential method) in which color display is performed by time division is employed. The black matrix is preferably provided so as to overlap transistors and a CMOS circuit for the sake of reducing reflection of external light by wirings of the transistor and the CMOS circuit. Further, the black matrix may be provided so as to overlap a capacitor. This is because the black matrix can prevent reflection due to a metal film included in the capacitor.

An FPC 394 which is a wiring board for connection is provided for a terminal electrode layer 378 which is electrically connected to the pixel region, with an anisotropic conductive layer 396 interposed therebetween. The FPC 394 functions to transmit signals and potentials from outside.

In the liquid crystal display device in this embodiment mode as described above, the semiconductor element is formed using the semiconductor substrate described in Embodiment Mode 1; therefore, even when the glass substrate is used as the base substrate in the liquid crystal display device, a single crystal semiconductor can be used to form the semiconductor layer of the semiconductor element so that a liquid crystal display device with stable operation, that is, high reliability, and high performance can be provided. According to this, a more complicated driving method or image processing method can be adopted, which leads to improvement of display quality.

Embodiment Mode 4

In this embodiment mode, a semiconductor device including a light-emitting element (a light-emitting display device) will be described as an example of the semiconductor device of the present invention, using FIGS. 7A and 7B. According to this embodiment mode, a light-emitting display device is manufactured using the semiconductor substrate described in Embodiment Mode 1 so that a light-emitting display device with high performance and high reliability can be provided.

Figure 7A:
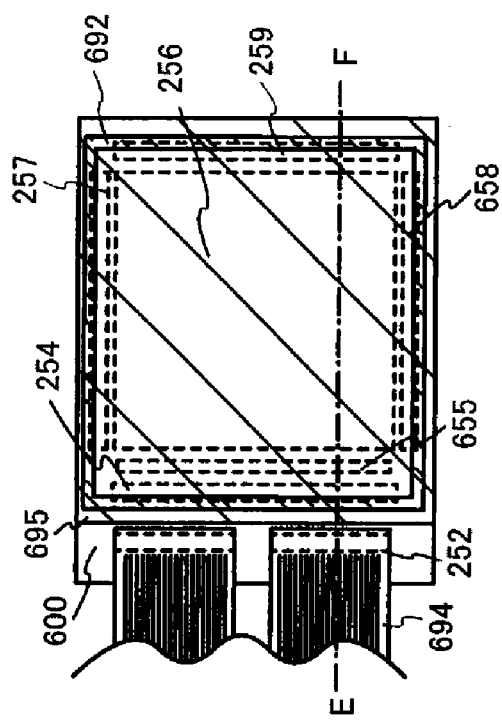
FIGS. 7A and 7B are diagrams describing a semiconductor device of the present invention.
Figure 7B:
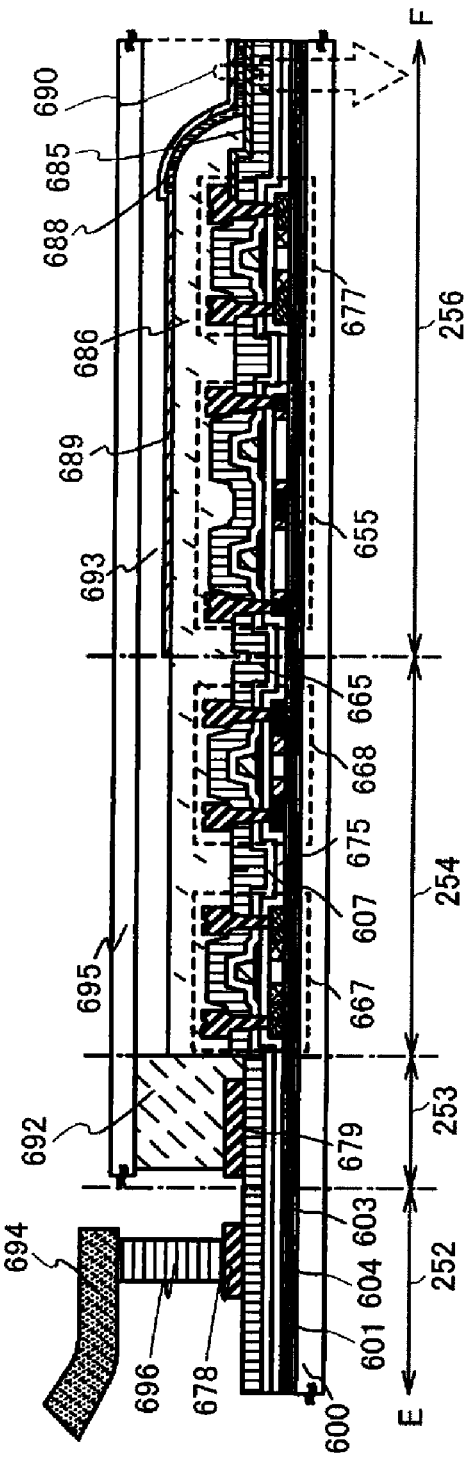

The semiconductor device shown in FIGS. 7A and 7B employs a bottom-emission structure in which light is emitted in a direction indicated by an arrow. FIG. 7A is a top view of the semiconductor device, and FIG. 7B is a cross-sectional view of FIG. 7A taken along line E-F. In FIGS. 7A and 7B, the semiconductor device includes an external terminal connection region 252, a sealing region 253, a driver circuit region 254, and a pixel region 256. In a bottom-emission light-emitting display device, it is necessary that an element substrate (i.e., a base substrate) have light-transmitting properties. As the substrate having light-transmitting properties, a glass substrate which is inexpensive and easily increased in area is used in practice, instead of a quartz substrate which is expensive and has difficulty in increasing of area. By using the semiconductor substrate described in Embodiment Mode 1, a light-emitting display device using a glass substrate and including a semiconductor element which includes a high-performance semiconductor layer made of a single crystal semiconductor or the like and operates stably since the effect of contamination from the glass substrate is reduced can be provided.

The semiconductor device shown in FIGS. 7A and 7B includes an element substrate 600, a thin film transistor 655, a thin film transistor 677, a thin film transistor 667, a thin film transistor 668, a light-emitting element 690 including a first electrode layer 685, a light-emitting layer 688, and a second electrode layer 689, a filler 693, a sealant 692, a bonding layer 604, a barrier layer 603, a gate insulating layer 675, an insulating film 607, an insulating film 665, an insulating layer 686, a sealing substrate 695, a wiring layer 679, a terminal electrode layer 678, an anisotropic conductive layer 696, and an FPC 694. The semiconductor device includes an external terminal connection region 252, a sealing region 253, a driver circuit region 254, and a pixel region 256. The filler 693 can be made of gas or liquid composition; in the case of liquid composition, the filler 693 can be formed by a dropping method. The element substrate 600 and the sealing substrate 695 are attached to each other so that sealing of the semiconductor device (light-emitting display device) is performed. In the light-emitting display device in this embodiment mode, a semiconductor element is manufactured as described in Embodiment Mode 2, using the semiconductor substrate described in Embodiment Mode 1. Accordingly, even in the case of a light-emitting display device using a light-transmitting substrate, i.e., a glass substrate, a single crystal semiconductor layer can be used as a semiconductor layer of a semiconductor element so that a high-performance semiconductor element can be formed. Further, contamination from the glass substrate can be prevented so that a semiconductor element with stable operation, that is, high reliability can be formed. Accordingly, a light-emitting display device with high performance and high reliability can be provided. Further, a pixel region and a driver circuit region requiring high speed operation can be formed over the same substrate. In this case, transistors in the pixel region 256 and transistors in the driver circuit region 254 are formed at the same time. A driver circuit region 658 may also be formed over the same substrate.

In the semiconductor device shown in FIGS. 7A and 7B, one or both of the first electrode layer 685 and the second electrode layer 689 is formed of a light-transmitting conductive material so as to transmit light emitted from the light-emitting element 690. An electrode which is formed to transmit no light may be formed of a conductive material having light-reflective properties which reflects light emitted from the light-emitting element 690.

The light-emitting layer 688 can be formed of either one or both of an organic compound and an inorganic compound. Elements each including a first electrode layer, a light-emitting layer, and a second electrode layer, which are called light-emitting elements, are classified into the following two kinds: an organic EL element using an organic material as a main material and an inorganic EL element using an inorganic material as a main material.

Description will be made on the case where the light-emitting element of the light-emitting display device is an organic EL element. As a material of the light-emitting layer, either of a low-molecular-based material or a high-molecular-based material may be used. An inorganic compound may be used as part of the material of the light-emitting layer. The light-emitting layer can be formed by either a wet method or a dry method such as an evaporation method, an ink-jet method, a spin coating method, or a dip coating method. The light-emitting layer may have a single layer structure of the light-emitting layer itself or a combined structure of functional layers such as a hole-injecting layer, a hole-transporting layer, a hole-blocking layer, a light-emitting layer, an electron-transporting layer, an electron-injecting layer, etc. In the case of the light-emitting layer with a multilayer structure, a layer having two or more functions of the functions of the layers may be included. Any known structure may be employed for the light-emitting element.

Description will be made on the case where the light-emitting element of the light-emitting display device is an inorganic EL element. Inorganic EL elements are classified into the following two kinds; a dispersion-type inorganic EL element including an electroluminescence layer in which particles of a light-emitting material are dispersed into a binder and a thin film inorganic EL element including an electroluminescence layer made of a thin film of a light-emitting material. Either of these can be employed in this embodiment mode. Roughly speaking, inorganic EL elements each have a structure in which an electroluminescence layer is included between a first electrode layer and a second electrode layer. An insulating layer may be provided between either of the electrode layers and the electroluminescence layer. The insulating layer may be provided between the electroluminescence layer and either one or both of the electrode layers. In addition, the insulating layer may be formed of a single layer or a plurality of layers. In addition, any known structure can be adopted.

Pixels of a semiconductor device including a light-emitting element can be driven by a passive matrix mode or an active matrix mode. In addition, either digital driving or analog driving can be employed.

The sealing substrate may be provided with a color filter (a coloring layer). The color filter (coloring layer) can be formed by an evaporation method or a droplet discharge method. The color filter (coloring layer) enables high-definition display. This is because a broad peak can be modified to be sharp in a light emission spectrum of each of RGB by the color filter (coloring layer).

Full color display can be achieved by depositing a material which emits monochromatic light in combination and combining with a color filter or a color conversion layer. The color filter (coloring layer) or the color conversion layer may be, for example, provided for the sealing substrate and then attached to the element substrate.

Display of monochromatic emission may also be performed. For example, an area color type semiconductor device may be formed by using monochromatic emission.

The area color type is suited to display of characters or symbols because a passive matrix type driving method is preferable for the area color type.

In this embodiment mode, since the semiconductor substrate described in Embodiment Mode 1 is used, the single crystal semiconductor layer can be used as an active layer of the semiconductor element. Therefore, the driver circuit region requiring high speed operation and the pixel region can be formed over the substrate. Further, since the semiconductor element formed using the semiconductor substrate described in Embodiment Mode 1 operates stably, a highly reliable display device can be provided.

Transistors provided in the semiconductor device of this embodiment mode shown in FIGS. 7A and 7B can be manufactured in a similar manner to the transistors described in Embodiment Mode 2.

Embodiment Mode 5

A television device can be completed using a semiconductor device which includes a display element formed by the present invention. An example of a television device which aims to provide high performance will be described.

Figure 8:
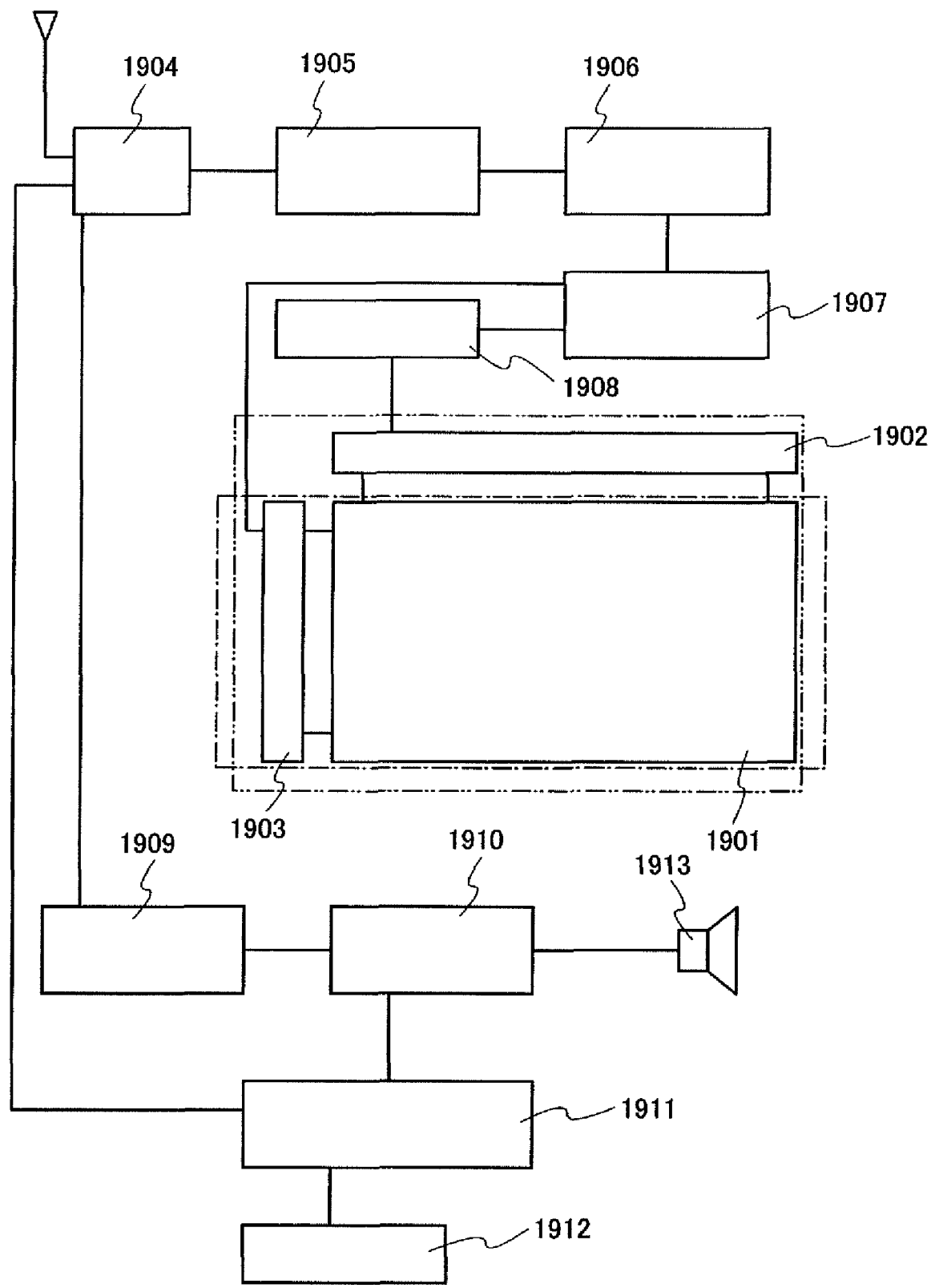
FIG. 8 is a block diagram showing a main structure of an electronic device to which the present invention is applied.

FIG. 8 is a block diagram showing a main structure of a television device (a liquid crystal television device or an EL television device).

A TFT is formed in a display panel, and a pixel region 1901 and a scanning line driver circuit 1903 are integrally formed over a substrate, and a separate driver IC is mounted for a signal line driver circuit 1902. Alternatively, the pixel region 1901 and the signal line driver circuit 1902 and the scanning line driver circuit 1903 are integrally formed over the substrate. They may have any other structure. As for the structures of other external circuits, a video signal amplifier circuit 1905 for amplifying video signals among signals received at a tuner 1904; a video signal processing circuit 1906 for converting signals output from the video signal amplifier circuit 1905 into color signals corresponding to red, green, and blue; a control circuit 1907 for converting the video signals so as to be input into the driver ICs; and the like are provided on the input side of the video signals. The control circuit 1907 outputs a signal to each of the scan line side and the signal line side. In the case of digital driving, a signal divider circuit 1908 may be provided on the signal line side such that input digital signals can be divided into m pieces to be supplied.

Audio signals among the signals received at the tuner 1904 are transmitted to an audio signal amplifier circuit 1909, and an output thereof is supplied to a speaker 1913 through an audio signal processing circuit 1910. A control circuit 1911 receives control information on a receiving station (receiving frequency) or sound volume from an input portion 1912 and transmits the signal to the tuner 1904 or the audio signal processing circuit 1910.

Figure 9A:
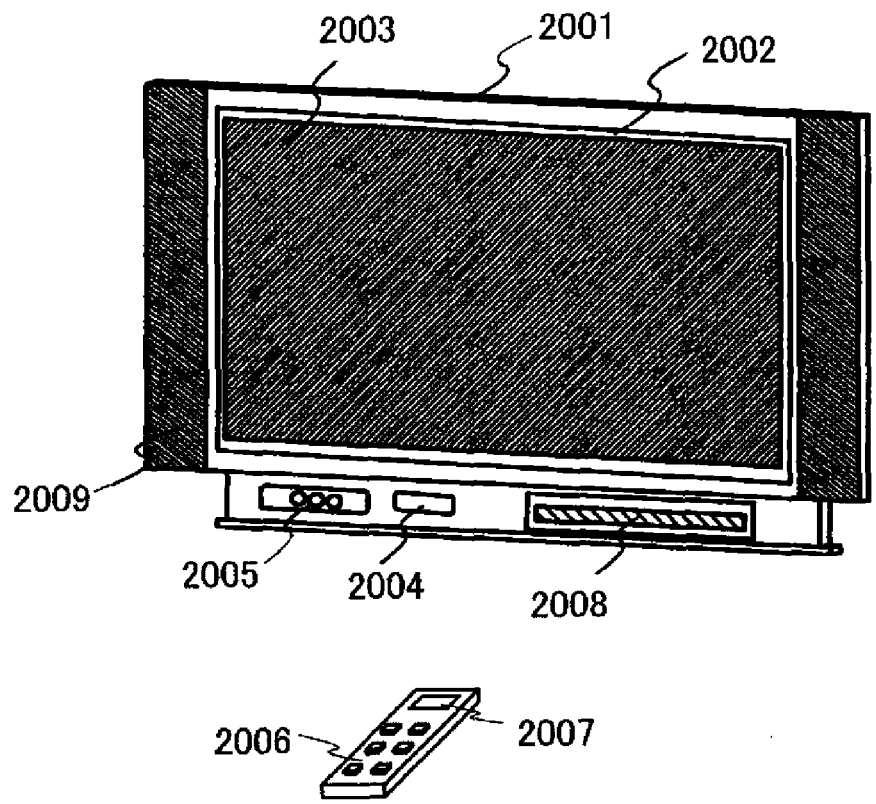
FIGS. 9A and 9B are diagrams each showing an electronic device to which the present invention is applied.
Figure 9B:
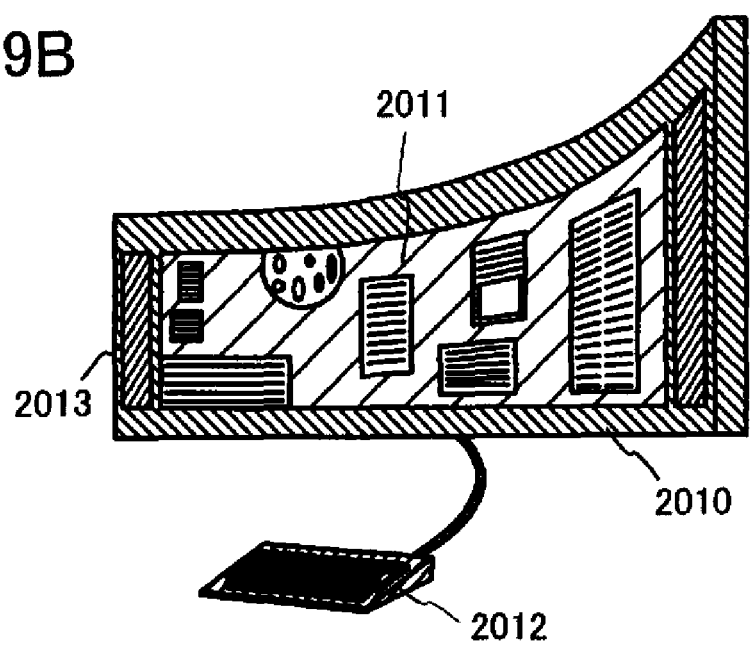

A television device can be completed by incorporation of a display module into a chassis as shown in FIGS. 9A and 9B. A display panel as shown in FIGS. 7A and 7B, which is provided with an FPC, is generally called an EL display module. Using an EL display module shown in FIGS. 7A and 7B, an EL television device can be completed. Using a liquid crystal display module as shown in FIGS. 6A and 6B, a liquid crystal television device can be completed. A main screen 2003 is formed using the display module, and a speaker portion 2009, an operation switch, and the like are provided as its accessory equipment. Thus, a television device can be completed by the present invention.

In addition, reflected light of light entering from outside may be blocked with the use of a retardation plate or a polarizing plate. In a top-emission semiconductor device, an insulating layer which serves as a bank may be colored to be used as a black matrix. The bank can be formed by a droplet discharge method or the like as well, using pigment-based black resin or a resin material such as polyimide mixed with carbon black or the like, or a stack of these. The bank may also be formed by depositing different materials in the same region a plurality of times by a droplet discharge method. As the retardation plates, a $\lambda/4$ plate and a $\lambda/2$ plate may be used to control light. Employed is a structure in which a light-emitting element, a sealing substrate (sealant), the retardation plates ($\lambda/4$ plate and $\lambda/2$ plate), and a polarizing plate are provided in this order over a substrate for a TFT element. Light emitted from the light-emitting element travels through these layers to be emitted outside from the polarizing plate side. The retardation plate or the polarizing plate may be provided on a side from which light is emitted or may be provided on both sides in the case of a dual-emission semiconductor device in which light is emitted from both the sides. In addition, an anti-reflection film may be provided for the outer side of the polarizing plate. Accordingly, an image with higher resolution and precision can be displayed.

As shown in FIG. 9A, a display panel 2002 using a display element is incorporated in a housing 2001 and a receiver 2005 is connected to a communication network by wired or wireless connections via a modem 2004 to receive general TV broadcast so that one-way (from sender to receiver) or two-way (between sender and receiver or between receivers) information communication can be carried out. Operations of the television device can be carried out using switches incorporated into the chassis or by a remote control device 2006 provided separately, and the remote control device may be provided for a display portion 2007 that displays information output thereto.

Further, the television device may include a sub-screen 2008 formed using a second display panel to display channels, volume, or the like, in addition to the main screen 2003. In this structure, the main screen 2003 may be formed of an EL display panel superior in a viewing angle, and the sub-screen may be formed of a liquid crystal display panel capable of display with low power consumption. Alternatively, in order to prioritize less power consumption, a structure may be employed in which the main screen 2003 is formed using a liquid crystal display panel, the sub-screen 2008 is formed using an EL display panel, and the sub-screen is able to be turned on and off. According to the present invention, a semiconductor device with high performance and high reliability can be manufactured with high productivity even when such a large substrate, and many TFTs and electronic components are used.

FIG. 9B shows a television device having a large display portion with a size of 20 to 80 inches. The television device includes a housing 2010, a keyboard portion 2012 which is an operation portion, a display portion 2011, speakers 2013, and the like. The present invention is applied to the display portion 2011. The display portion in FIG. 9B is formed using a flexible material, and thus the display portion is curved in the television device. Since the shape of the display portion can be freely designed as described above, a television device having a desired shape can be manufactured.

According to the present invention, a display device with high performance and high reliability can be manufactured. Therefore, a television device with high performance and high reliability can be manufactured with high productivity.

That the present invention is not limited to a television device and can be applied to a variety of uses, such as a monitor of a personal computer, a large display medium such as an information display board at the train station, the airport, or the like, or an advertisement display board on the street.

Embodiment Mode 6

In this embodiment mode, an example of a semiconductor device which aims to provide high performance and high reliability will be described. Specifically, as an example of the semiconductor device, examples of a microprocessor and a semiconductor device which has an arithmetic function and can transmit and receive data without contact will be described.

Figure 10:
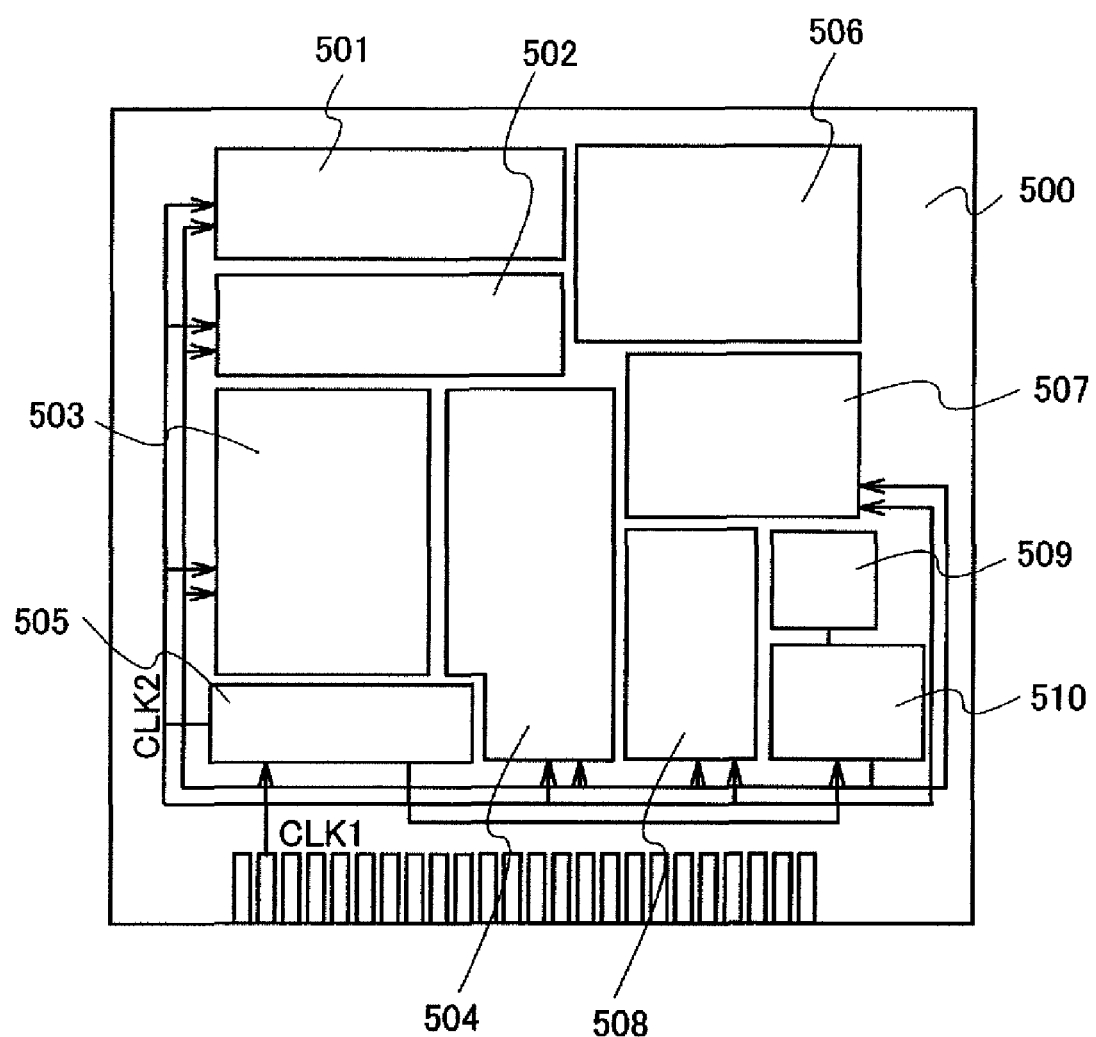
FIG. 10 is a block diagram showing a structure of a microprocessor using a semiconductor substrate of the present invention.

In FIG. 10, a microprocessor 500 will be described as an example of the semiconductor device. This microprocessor 500 is manufactured using the semiconductor substrate according to this embodiment mode as described above. This microprocessor 500 includes an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory (ROM) 509, and a memory interface (ROM I/F) 510.

An instruction input to the microprocessor 500 through the bus interface 508 is input to the instruction decoder 503, decoded therein, and then input to the ALU controller 502, the interrupt controller 504, the register controller 507, and the timing controller 505. The ALU controller 502, the interrupt controller 504, the register controller 507, and the timing controller 505 conduct various controls based on the decoded instruction. In specific, the ALU controller 502 generates signals for controlling operation of the ALU 501. While the microprocessor 500 executes a program, the interrupt controller 504 processes an interrupt request from an external input/output device or a peripheral circuit based on its priority or a mask state. The register controller 507 generates an address of the register 506, and reads and writes data from and to the register 506 in accordance with the state of the microprocessor 500. The timing controller 505 generates signals for controlling timing of operation of the ALU 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1, and supplies the internal clock signal CLK2 to the above-described various circuits. Note that the microprocessor 500 shown in FIG. 10 is only an example in which the structure is simplified, and an actual microprocessor may have various structures depending on the uses.

Since an integrated circuit is formed using a single crystal semiconductor layer whose crystals are oriented in a certain direction and which is bonded to a glass substrate in the microprocessor 500, higher processing speed and lower power consumption can be achieved.

Figure 11:
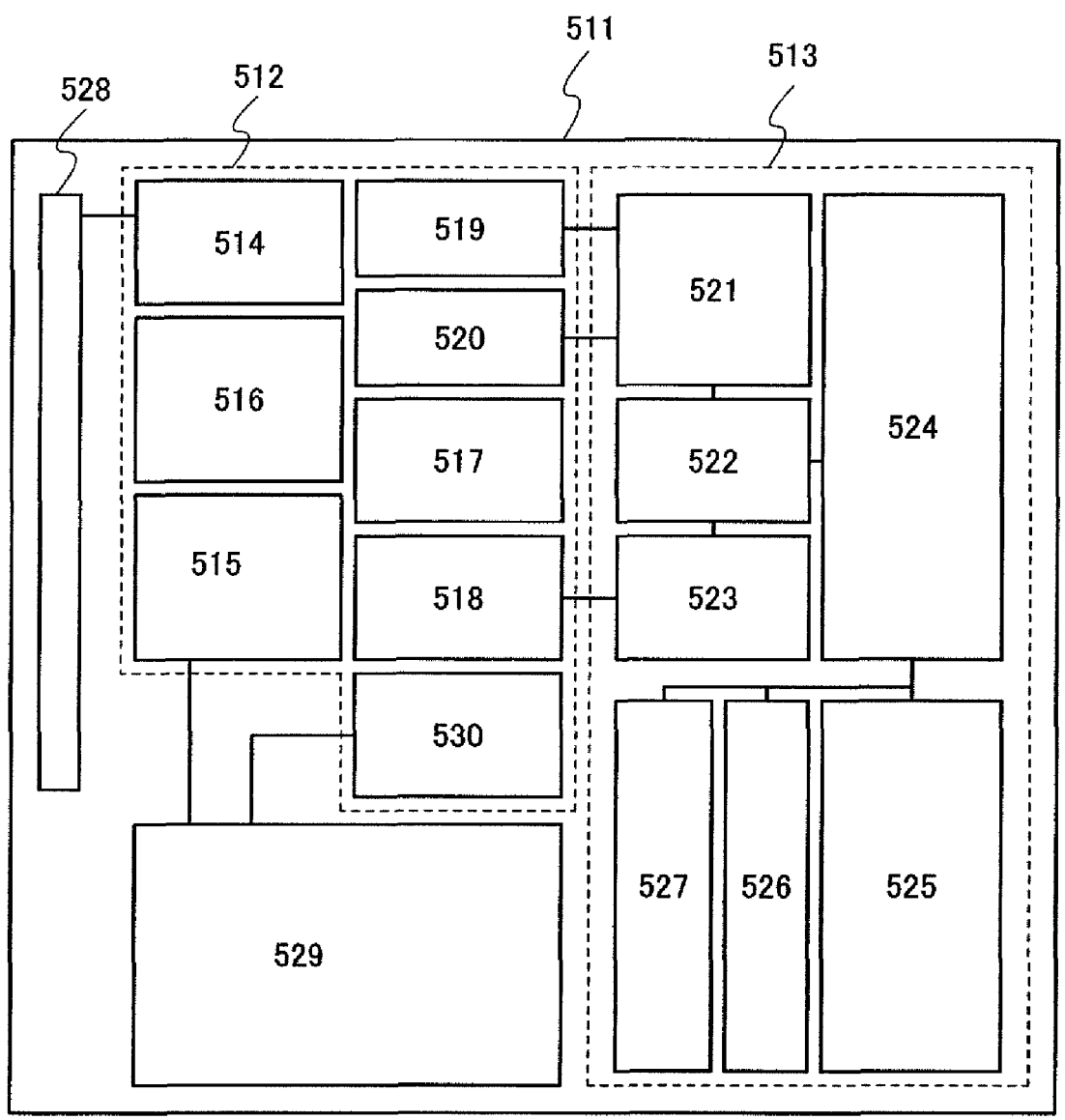
FIG. 11 is a block diagram showing a structure of an RFCPU using a semiconductor substrate of the present invention.

Next, an example of a semiconductor device having an arithmetic function that is capable of data transmission and reception without contact will be described with reference to FIG. 11. FIG. 11 is an example of a computer (hereinafter referred to as an RFCPU) which operates by transmitting and receiving signals to/from an external device by wireless communication. An RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, a modulation circuit 520, and a power supply control circuit 530. The digital circuit portion 513 includes an RF interface 521, a control register 522, a clock controller 523, a CPU interface 524, a central processing unit 525, a random access memory 526, and a read only memory 527.

The operation of the RFCPU 511 having such a structure is roughly as follows. The resonance circuit 514 generates an induced electromotive force based on a signal received by an antenna 528. The induced electromotive force is stored in a capacitor portion 529 through the rectifier circuit 515. This capacitor portion 529 is preferably formed using a capacitor such as a ceramic capacitor or an electric double layer capacitor. The capacitor portion 529 and the RFCPU 511 are not necessarily formed over the same substrate, and the capacitor portion 529 may be attached as a component to an insulating-surface substrate included in the RFCPU 511.

The reset circuit 517 generates a signal for resetting and initializing the digital circuit portion 513. For example, the reset circuit generates a signal which rises with delay after rise in the power source voltage, as a reset signal. The oscillation circuit 518 changes the frequency and the duty ratio of a clock signal in accordance with a control signal generated by the constant voltage circuit 516. The demodulator circuit 519 including a low-pass filter binarizes the amplitude of, for example, a received amplitude-modulated (ASK) signal. The modulator circuit 520 varies the amplitude of an amplitude-modulated (ASK) transmission signal and transmits the signal. The modulation circuit 520 changes the resonance point of the resonance circuit 514, thereby changing the amplitude of a communication signal. The clock controller 523 generates a control signal for changing the frequency and duty ratio of a clock signal in accordance with the power supply voltage or a consumption current of the central processing unit 525. The power supply voltage is monitored by the power management circuit 530.

A signal input from the antenna 528 to the RFCPU 511 is demodulated by the demodulator circuit 519 and then decomposed into a control command, data, and the like by the RF interface 521. The control command is stored in the control register 522. The control command includes reading of data stored in the read-only memory 527, writing of data to the random-access memory 526, an arithmetic instruction to the central processing unit 525, and the like. The central processing unit 525 accesses the read-only memory 527, the random access memory 526, and the control register 522 via the CPU interface 524. The CPU interface 524 has a function of generating an access signal for any of the read-only memory 527, the random-access memory 526, and the control register 522 based on an address the central processing unit 525 requests.

As an arithmetic method of the central processing unit 525, a method may be employed in which the read-only memory 527 stores an operating system (OS) in advance and a program is read and executed at the time of starting operation. Alternatively, a method may be employed in which a circuit dedicated to arithmetic is formed as an arithmetic circuit and an arithmetic processing is conducted using hardware. As a method in which both hardware and software are used, a method in which part of processing is carried out by a dedicated arithmetic circuit and the other part of the arithmetic processing is executed by the central processing unit 525 using a program can be employed.

Since an integrated circuit is formed using a single crystal semiconductor layer whose crystals are oriented in a certain direction and which is bonded to a glass substrate in the RFCPU 511, higher processing speed and lower power consumption can be achieved. Accordingly, even when the capacitor portion 529 which supplies electric power is miniaturized, long-term operation can be secured.

Embodiment Mode 7

This embodiment mode will be described using FIG. 12. In this embodiment mode, an example of a module using a panel including the semiconductor substrate or the semiconductor device manufactured in any of Embodiment Modes 1 to 8 will be described. In this embodiment mode, an example of a module including a semiconductor device which aims to provide high performance and high reliability will be described.

Figure 12A:
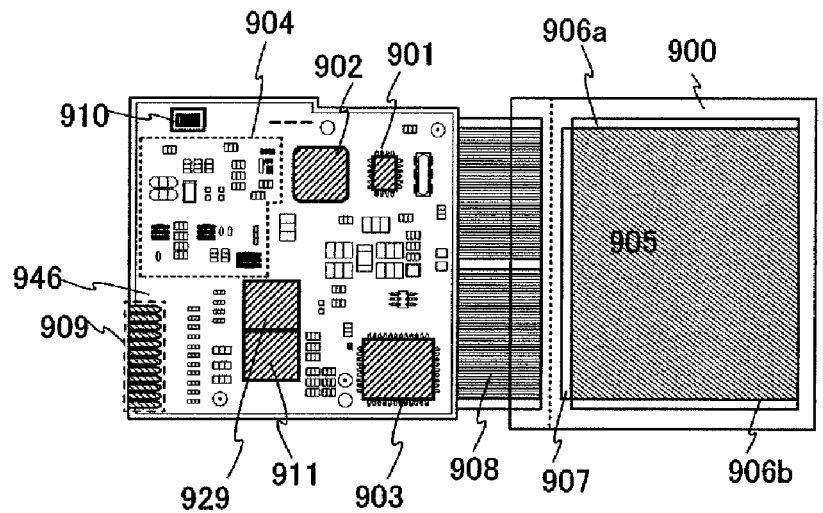
FIGS. 12A and 12B are diagrams showing an electronic device to which the present invention is applied.

An information terminal module shown in FIG. 12A has a printed circuit board 946 over which a controller 901, a central processing unit (CPU) 902, a memory 911, a power source circuit 903, an audio processing circuit 929, a transmission/reception circuit 904, and other elements such as a resistor, a buffer, and a capacitor are mounted. In addition, a panel 900 is connected to the printed wiring board 946 through a flexible printed circuit (FPC) 908.

The panel 900 is provided with a pixel region 905 having a light-emitting element in each pixel, a first scanning line driver circuit 906a and a second scanning line driver circuit 906b which select a pixel included in the pixel region 905, and a signal line driver circuit 907 which supplies a video signal to the selected pixel.

Various control signals are input and output through an interface (VF) 909 provided over the printed wiring board 946. An antenna port 910 for transmitting and receiving signals with an antenna is provided over the printed wiring board 946.

In this embodiment mode, the printed wiring board 946 is connected to the panel 900 through the FPC 908; however, the present invention is not limited to this structure. The controller 901, the audio processing circuit 929, the memory 911, the CPU 902, or the power source circuit 903 may be directly mounted on the panel 900 by a COG (chip on glass) method. Moreover, various elements such as a capacitor and a buffer provided for the printed wiring board 946 prevent superimposition of a noise on a power source voltage or a signal and delay in rise of a signal.

Figure 12B:
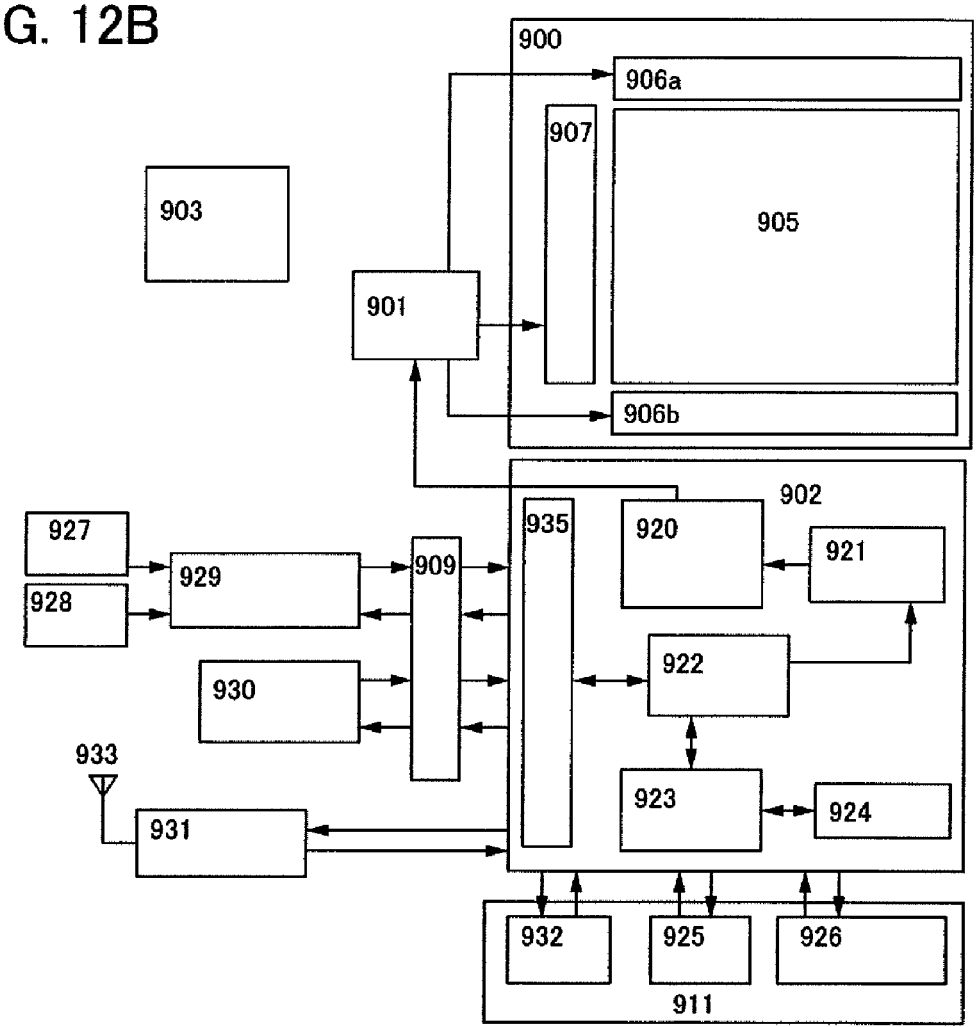

FIG. 12B is a block diagram of the module shown in FIG. 12A. This module 999 has a VRAM 932, a DRAM 925, a flash memory 926, and the like included in the memory 911. The VRAM 932 stores data of an image to be displayed on the panel 900, the DRAM 925 stores image data or audio information, and the flash memory 926 stores various programs.

The power source circuit 903 generates a power source voltage applied to the panel 900, the controller 901, the CPU 902, the audio processing circuit 929, the memory 911, and a transmission/reception circuit 931. There is a case where a current source is provided in the power source circuit 903 depending on the specifications of the panel.

The CPU 902 includes a control signal generating circuit 920, a decoder 921, a register 922, an arithmetic circuit 923, a RAM 924, a CPU interface 935, and the like. Various signals inputted to the CPU 902 through the interface 935 are held in the resister 922 and then inputted to the arithmetic circuit 923, the decoder 921, and the like. The arithmetic circuit 923 performs operation based on the inputted signal and specifies an address to send various instructions. Meanwhile, a signal inputted to the decoder 921 is decoded and inputted to the control signal generating circuit 920. The control signal generating circuit 920 generates a signal containing various instructions based on the inputted signal and sends it to the address specified by the arithmetic circuit 923, which are specifically the memory 911, the transmission/reception circuit 931, the audio processing circuit 929, the controller 901, or the like.

Each of the memory 911, the transmission/reception circuit 931, the audio processing circuit 929, and the controller 901 operates in accordance with the received instruction. The operation will be described briefly below.

The signal input from an input unit 930 is transmitted to the CPU 902 mounted on the printed wiring board 946 through the interface 909. The control signal generating circuit 920 converts the image data stored in the VRAM 932 into a predetermined format in accordance with the signal transmitted from the input unit 930 such as a pointing device or a keyboard, and then transmits to the controller 901.

The controller 901 processes a signal containing image data transmitted from the CPU 902 in accordance with the specifications of the panel and supplies to the panel 900. The controller 901 generates a Hsync signal, a Vsync signal, a clock signal CLK, alternating voltage (AC Cont), and a switching signal L/R based on the power supply voltage inputted from the power supply circuit 903 and various signals inputted from the CPU 902 and supplies to the panel 900.

The transmission/reception circuit 904 processes signals which are transmitted and received as electromagnetic waves by an antenna 933. In specific, the transmission/reception circuit 904 includes a high frequency circuit such as an isolator, a band pass filter, a VCO (voltage controlled oscillator), an LPF (low pass filter), a coupler, or a balun. Among the signals transmitted and received by the transmission/reception circuit 904, signals containing audio information are transmitted to the audio processing circuit 929 in accordance with an instruction transmitted from the CPU 902.

The signal containing audio information transmitted in accordance with the instruction of the CPU 902 is demodulated into an audio signal by the audio processing circuit 929 and transmitted to a speaker 928. The audio signal transmitted from a microphone 927 is modulated in the audio processing circuit 929 and transmitted to the transmission/reception circuit 904 in accordance with the instruction from the CPU 902.

The controller 901, the CPU 902, the power source circuit 903, the audio processing circuit 929, and the memory 911 can be incorporated as a package of this embodiment mode. This embodiment mode can be applied to any circuits other than a high frequency circuit such as an isolator, a band pass filter, a VCO (voltage controlled oscillator), an LPF (low pass filter), a coupler, or a balun.

Embodiment Mode 8

Figure 13:
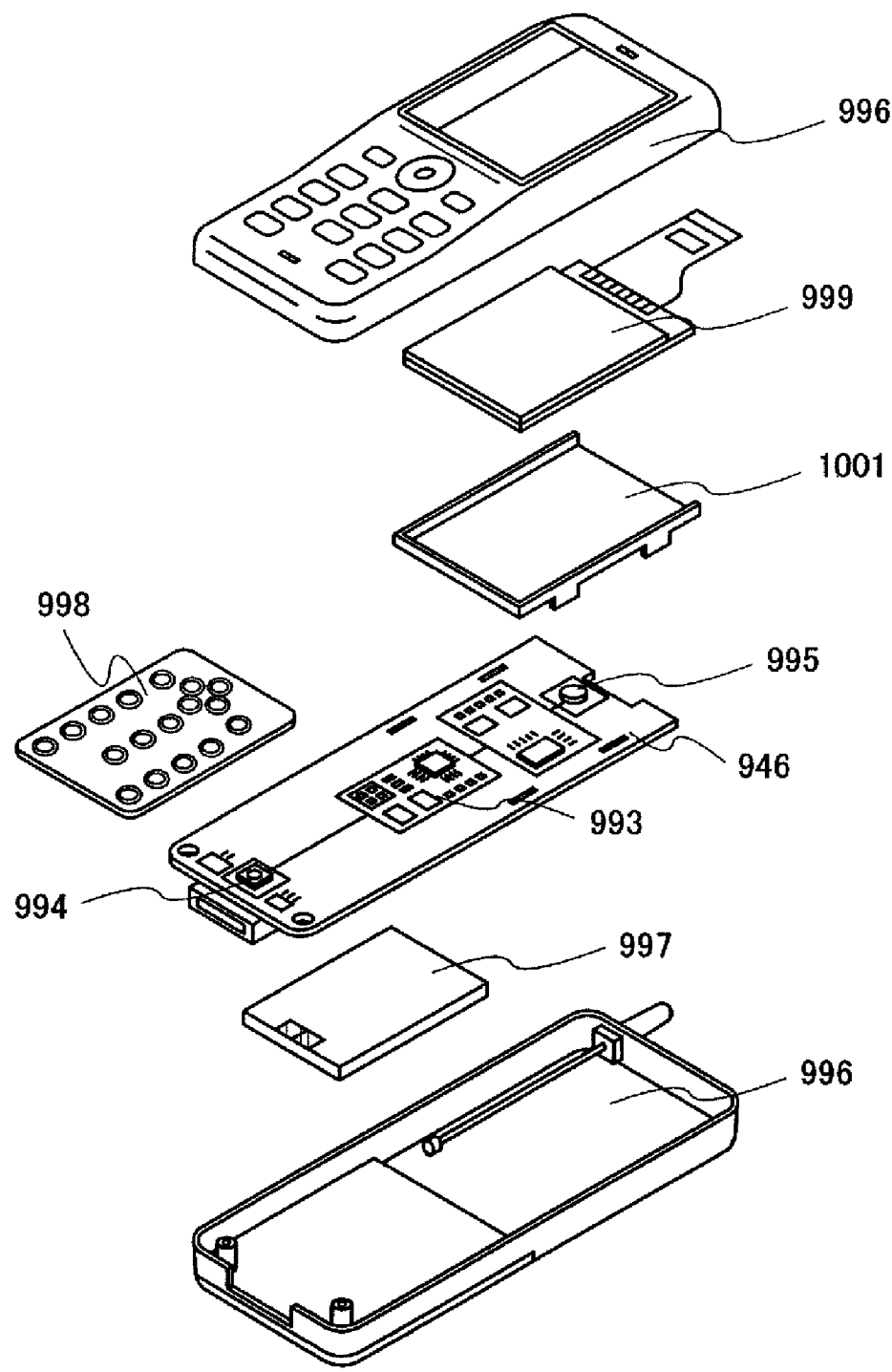
FIG. 13 is a diagram showing an electronic device to which the present invention is applied.

This embodiment mode will be described using FIG. 13. FIG. 13 shows one mode of a portable phone (mobile phone) including the module manufactured in Embodiment Mode 9, which operates wirelessly and is portable. A panel 900 is detachably incorporated into a housing 1001 so as to be easily combined with a module 999. The shape and size of the housing 1001 can be appropriately changed in accordance with an electronic device incorporated therein. The mobile phone described in this embodiment mode is manufactured using the semiconductor substrate described in Embodiment Mode 1, and thus has high performance and high reliability.

The housing 1001 in which the panel 900 is fixed is fitted to the printed wiring board 946 and set up as a module. A controller, a CPU, a memory, a power supply circuit, and other elements such as a resistor, a buffer, and a capacitor are mounted on the printed wiring board 946. Moreover, an audio processing circuit including a microphone 994 and a speaker 995 and a signal processing circuit 993 such as a transmission/reception circuit are provided. The panel 900 is connected to the printed circuit board 946 through the FPC 908.

Such a module 999, an input means 998, and a buttery 997 are stored in a chassis 996. The pixel region of the panel 900 is arranged so that it can be seen through a window formed in the housing 996.

The housing 996 shown in FIG. 13 shows an exterior shape of a phone as an example. However, the electronic device according to this embodiment mode can have various modes depending on its function or use. Examples of the modes will be explained in the following embodiment mode.

Embodiment Mode 9

By applying the present invention, various semiconductor devices having a display function can be manufactured. That is, the present invention is applicable to various electronic devices in which these semiconductor devices having a display function are incorporated into display portions. In this embodiment mode, examples of electronic devices including a semiconductor device having a display function to provide high performance and high reliability will be described.

As such electronic devices according to the present invention, television devices (also referred to simply as televisions or television receivers), cameras such as digital cameras or digital video cameras, cellular phone sets (also referred to simply as cellular phones or mobile phones), portable information terminals such as PDAs, portable game machines, monitors for computers, computers, audio reproducing devices such as car audio systems, image reproducing devices provided with a recording medium such as home game machines (typically, a digital versatile disc (DVD)), and the like can be given. Specific examples thereof will be described with reference to FIGS. 14A to 14E.

Figure 14A:
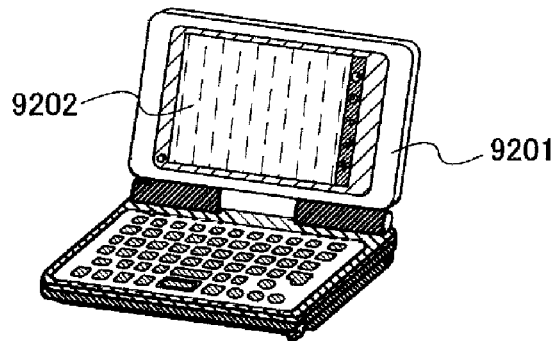
FIGS. 14A to 14E are diagrams each showing an electronic device to which the present invention is applied.

A portable information terminal shown in FIG. 14A includes a main body 9201, a display portion 9202, and the like. The semiconductor device of the present invention can be applied to the display portion 9202. As a result, a portable information terminal device with high performance and high reliability can be provided.

Figure 14B:
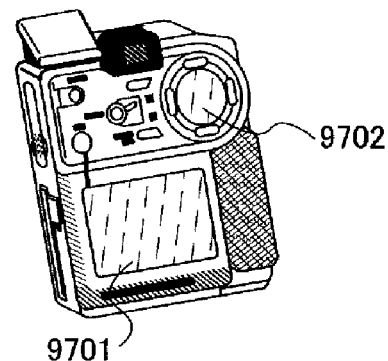

A digital video camera shown in FIG. 14B includes a display portion 9701, a display portion 9702, and the like. The semiconductor device of the present invention is applicable to the display portion 9701. As a result, a digital video camera with high performance and high reliability can be provided.

Figure 14C:
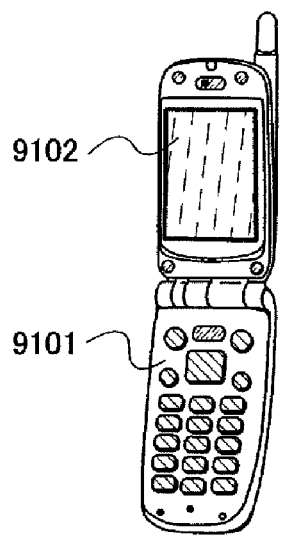

A mobile phone shown in FIG. 14C includes a main body 9101, a display portion 9102, and the like. The semiconductor device of the present invention is applicable to the display portion 9102. As a result, a mobile phone with high performance and high reliability can be provided.

Figure 14D:
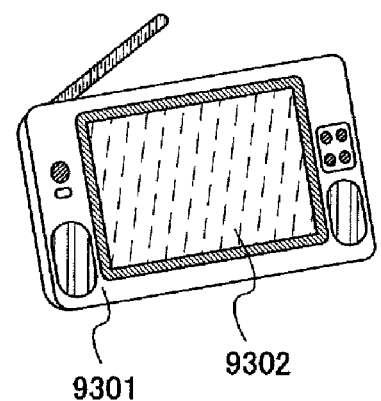

A portable television device shown in FIG. 14D includes a main body 9301, a display portion 9302, and the like. The semiconductor device of the present invention is applicable to the display portion 9302. As a result, a portable television device with high performance and high reliability can be provided. The semiconductor device of the present invention can be applied to various types of television devices including a small-sized television incorporated in a portable terminal such as a mobile phone, a medium-sized television that is portable, and a large-sized television (e.g., greater than or equal to 40 inches).

Figure 14E:
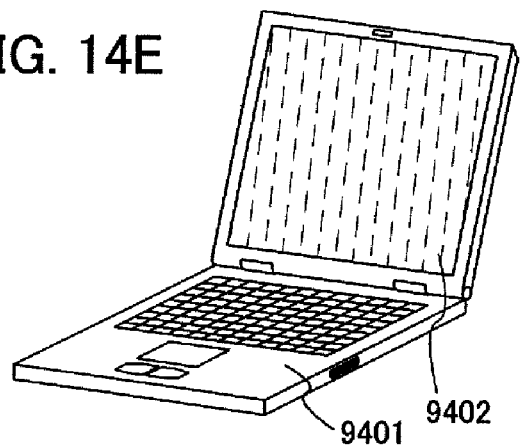

A portable computer shown in FIG. 14E includes a main body 9401, a display portion 9402, and the like. The semiconductor device of the present invention is applicable to the display portion 9402. As a result, a portable computer with high performance and high reliability can be provided.

In this manner, according to the semiconductor device of the present invention, electronic devices with high performance and high reliability can be provided.

This application is based on Japanese Patent Application serial no. 2007-272297 filed with Japan Patent Office on Oct. 19, 2007, the entire contents of which are hereby incorporated by reference.

What is claimed is:

1. A method for manufacturing a semiconductor substrate, comprising:
   forming a bonding layer comprising one or a plurality of layers of phosphosilicate glass, borosilicate glass, and borophosphosilicate glass over a bond substrate using organosilane by a thermal CVD method at a temperature equal to or higher than 500° C. and equal to or lower than 800° C.;
   adding ions from a surface side where the bonding layer is formed to form a damaged region at a given depth of the bond substrate; and
   performing thermal treatment by which the damaged region cracks and the bond substrate is separated at the damaged region, in a state in which the bond substrate and a glass substrate are overlapped with the bonding layer interposed therebetween, so that a semiconductor layer which is separated from the bond substrate is formed over the glass substrate.

2. The method for manufacturing a semiconductor substrate, according to claim 1, wherein reflow is performed at a temperature equal to or higher than 800° C. and equal to or lower than 1000° C. after the bonding layer is formed.

3. A method for manufacturing a semiconductor substrate, comprising:
   forming a silicon oxide film over a bond substrate;
   forming a bonding layer comprising one or a plurality of layers of phosphosilicate glass, borosilicate glass, and borophosphosilicate glass over the silicon oxide film using organosilane by a thermal CVD method at a temperature equal to or higher than 500° C. and equal to or lower than 800° C.;
   adding ions from a surface side where the bonding layer is formed to form a damaged region at a given depth of the bond substrate; and
   performing thermal treatment by which the damaged region cracks and the bond substrate is separated at the damaged region, in a state in which the bond substrate and a glass substrate are overlapped with the bonding layer interposed therebetween, so that a semiconductor layer which is separated from the bond substrate is formed over the glass substrate.

4. The method for manufacturing a semiconductor substrate, according to claim 3, wherein reflow is performed at a temperature equal to or higher than 800° C. and equal to or lower than 1000° C. after the bonding layer is formed.

5. A method for manufacturing a semiconductor substrate, comprising:
   forming a silicon oxide film over a single crystal silicon substrate by thermal oxidation;
   forming a bonding layer comprising one or a plurality of layers of phosphosilicate glass, borosilicate glass, and borophosphosilicate glass over the silicon oxide film using organosilane by a thermal CVD method at a temperature equal to or higher than 500° C. and equal to or lower than 800° C.;

adding ions from a surface side where the bonding layer is formed to form a damaged region at a given depth of the single crystal silicon substrate; and performing thermal treatment by which the damaged region cracks and the single crystal silicon substrate is separated at the damaged region, in a state in which the single crystal silicon substrate and a glass substrate are overlapped with the bonding layer interposed therebetween, so that a single crystal silicon layer which is separated from the single crystal silicon substrate is formed over the glass substrate.

6. The method for manufacturing a semiconductor substrate, according to claim 5, wherein reflow is performed at a temperature equal to or higher than 800° C. and equal to or lower than 1000° C. after the bonding layer is formed.

* * * * *